United States Patent
Aratake

(10) Patent No.: US 8,148,875 B2
(45) Date of Patent: Apr. 3, 2012

(54) PIEZOELECTRIC VIBRATOR, MANUFACTURING METHOD OF PIEZOELECTRIC VIBRATOR, OSCILLATOR, ELECTRONIC DEVICE, AND RADIO-CONTROLLED TIMEPIECE

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/845,142

(22) Filed: Jul. 28, 2010

(65) Prior Publication Data
US 2011/0025166 A1  Feb. 3, 2011

(30) Foreign Application Priority Data
Jul. 28, 2009  (JP) ................. 2009-175638

(51) Int. Cl.
*H01L 41/053*  (2006.01)
*H03H 9/17*  (2006.01)
(52) U.S. Cl. .............. 310/312; 310/344; 310/370
(58) Field of Classification Search .............. 310/312, 310/344, 370
See application file for complete search history.

(56) References Cited

U.S. PATENT DOCUMENTS

| 6,924,582 | B2 * | 8/2005 | Shimizu et al. | 310/312 |
| 7,948,157 | B2 * | 5/2011 | Iwatate et al. | 310/370 |
| 7,984,536 | B2 * | 7/2011 | Takahashi | 29/25.35 |
| 2002/0121175 | A1 * | 9/2002 | Kitamura et al. | 84/402 |
| 2008/0111627 | A1 * | 5/2008 | Fukuzawa | 330/261 |
| 2008/0129415 | A1 * | 6/2008 | Iwai | 333/188 |
| 2010/0237739 | A1 * | 9/2010 | Ouchi et al. | 310/312 |
| 2010/0237740 | A1 * | 9/2010 | Aratake et al. | 310/312 |
| 2010/0301954 | A1 * | 12/2010 | Fukuda | 331/116 R |
| 2011/0018388 | A1 * | 1/2011 | Fukuda | 310/312 |
| 2011/0148249 | A1 * | 6/2011 | Yamaguchi et al. | 310/312 |
| 2011/0169584 | A1 * | 7/2011 | Fukuda | 331/158 |

FOREIGN PATENT DOCUMENTS
JP  2003-142976 A  5/2003
* cited by examiner

*Primary Examiner* — Thomas Dougherty
(74) *Attorney, Agent, or Firm* — Brinks Hofer Gilson & Lione

(57) ABSTRACT

A piezoelectric vibrator which can be manufactured efficiently and a manufacturing method thereof are provided. The piezoelectric vibrator includes: a tuning-fork-type piezoelectric vibrating piece which has a pair of vibration arm portions, excitation electrodes formed on base end portions of the vibration arm portions, and weight metal films formed on distal end portions of the vibration arm portions; and a package which houses the piezoelectric vibrating piece therein. A gettering film on which a laser radiation flaw is formed is formed on intermediate portions between the base end portions and the distal end portions of the vibration arm portions. A first metal film included in the excitation electrode, a second metal film included in the weight metal film and the gettering film are formed using the same material.

7 Claims, 20 Drawing Sheets

PIEZOELECTRIC VIBRATOR, MANUFACTURING METHOD OF PIEZOELECTRIC VIBRATOR, OSCILLATOR, ELECTRONIC DEVICE, AND RADIO-CONTROLLED TIMEPIECE

RELATED APPLICATIONS

This application claims priority under 35 U.S.C. §119 to Japanese Patent Application No. 2009-175638 filed on Jul. 28, 2009, the entire content of which is hereby incorporated by reference.

BACKGROUND OF THE INVENTION

1. Field of the Invention

The present invention relates to a piezoelectric vibrator, a manufacturing method of a piezoelectric vibrator, an oscillator, an electronic device, and a radio-controlled timepiece.

2. Description of the Related Art

Recently, in a mobile phone or a portable information terminal device, as a timing source of a time source or a control signal, a reference signal source or the like, a piezoelectric vibrator which makes use of a piezoelectric vibrating piece made of a piezoelectric material such as crystal is used. As a piezoelectric vibrating piece, a tuning-fork-type piezoelectric vibrating piece having a pair of vibration arm portions is adopted.

As this kind of piezoelectric vibrator, an SMD (Surface Mount Device) piezoelectric vibrator is known.

As shown in FIG. 21 and FIG. 22, as an SMD piezoelectric vibrator 200, there has been proposed an SMD piezoelectric vibrator in which a package 209 is formed of a base substrate 201 and a lid substrate 202, and a piezoelectric vibrating piece 203 having a pair of vibration arm portions 204 is housed in a cavity C formed in the inside of the package 209. In this piezoelectric vibrating piece 203, weight metal films 211 are formed on distal end portions of the vibration arm portions 204 respectively for adjusting frequency of the piezoelectric vibrator 200, and excitation electrodes 212 which vibrate the pair of vibration arm portions 204 in the direction that the pair of vibration arm portions 204 approaches to each other or is separated from each other are formed on base end portions of the vibration arm portions 204 using a material which differs from a material of the weight metal films 211.

In general, it is desirable that an equivalent resistance value (effective resistance value: Re) of a piezoelectric vibrator is lowered as much as possible. The piezoelectric vibrator which has a low equivalent resistance value can vibrate piezoelectric vibrating pieces with low electric power and hence, such a piezoelectric vibrator constitutes a piezoelectric vibrator which exhibits high energy efficiency.

As one of general methods which suppress an equivalent resistance value, as shown in FIG. 21 and FIG. 22, there has been known a method where the inside of the cavity C in which the piezoelectric vibrating piece 203 is sealed is brought into an almost vacuum state thus lowering a serial resonance resistance value (R1) which has the proportional relationship with the equivalent resistance value. As a method for bringing the inside of the cavity C into a vacuum, there has been known a method (gettering) which activates a gettering film 220 formed on the vibration arm portion 204 by radiating a laser beam to the gettering film 220 from the outside (see Japanese patent 3998948). The gettering film 220 is formed continuously toward a weight-metal-film-211 side from the excitation electrode 212 using the same material (for example, aluminum) as the excitation electrode 212.

SUMMARY OF THE INVENTION

However, in the above-mentioned conventional piezoelectric vibrator, the weight metal film and the gettering film (excitation electrode) are formed using different materials and hence, it is necessary to manufacture the weight metal film and the gettering film separately in steps of manufacturing the piezoelectric vibrator thus deteriorating the manufacturing efficiency.

The present invention has been made under such circumstances, and it is an object of the present invention to provide a piezoelectric vibrator which can be manufactured efficiently and a manufacturing method thereof.

To overcome the above-mentioned drawbacks, the present invention provides following means.

According to one aspect of the present invention, there is provided a piezoelectric vibrator which includes: a tuning-fork-type piezoelectric vibrating piece having a pair of vibration arm portions, excitation electrodes which are formed on base end portions of the vibration arm portions, and weight metal films which are formed on distal end portions of the vibration arm portions; and a package which houses the piezoelectric vibrating piece therein, wherein a gettering film on which a laser radiation flaw is formed is formed on intermediate portions between the base end portions and the distal end portions of the vibration arm portions, and a first metal film included in the excitation electrode, a second metal film included in the weight metal film, and the gettering film are formed using the same material.

According to the present invention, the first metal film included in the excitation electrode, the second metal film included in the weight metal film, and the gettering film are formed using the same material and hence, in steps of manufacturing the piezoelectric vibrator, the first metal film, the second metal film and the gettering film can be simultaneously formed on the vibration arm portions so that the piezoelectric vibrator can be manufactured efficiently. Accordingly, it is possible to manufacture the piezoelectric vibrator at a low cost.

Further, the gettering film may be formed over the whole area of the intermediate portion.

In this case, the gettering film is formed over the whole area of the intermediate portion and hence, it is possible to increase the gettering area to which the gettering is applicable on the vibration arm portion.

Further, the first metal film, the second metal film and the gettering film are formed using the same material and hence, even when the gettering film is formed over the whole area of the intermediate portion, there is no possibility that the first metal film, the second metal film and the gettering film are dispersed from each other.

Further, the excitation electrode may be covered with an insulation film.

In this case, the excitation electrode is covered with the insulation film. Accordingly, in radiating a laser beam to the gettering film, even if a portion of the gettering film to which a laser beam is radiated is scattered toward an excitation electrode side, it is possible to make the portion of the gettering film adhere to the insulation film so that the adhesion of the scattered gettering film to the excitation electrode can be suppressed. Accordingly, possibility that the excitation electrode is short-circuited due to the adhesion of the scattered gettering film to the excitation electrode can be eliminated.

Further, the above-mentioned first metal film, second metal film and gettering film may be formed using one of chromium, titanium, vanadium or zirconium.

In this case, the piezoelectric vibrator can surely acquire the above-mentioned manner of operation and advantageous effects.

Further, according to another aspect of the present invention, there is provided a manufacturing method of a piezoelectric vibrator which includes: a tuning-fork-type piezoelectric vibrating piece having a pair of vibration arm portions, excitation electrodes which are formed on base end portions of the vibration arm portions, and weight metal films which are formed on distal end portions of the vibration arm portions; and a package which houses the piezoelectric vibrating piece therein, wherein gettering films on which laser radiation flaws are formed are formed on intermediate portions between the base end portions and the distal end portions of the vibration arm portions, wherein a first metal film included in the excitation electrode, a second metal film included in the weight metal film, and the gettering film are formed using the same material, and the manufacturing method includes a step of forming the first metal film, the second metal film and the gettering film on the vibration arm portions simultaneously.

According to the present invention, the first metal film included in the excitation electrode, the second metal film included in the weight metal film and the gettering film are formed using the same material and hence, the first metal film, the second metal film, and the gettering film are simultaneously formed on the vibration arm portions and hence, it is possible to manufacture the piezoelectric vibrator efficiently.

Further, an oscillator according to the present invention is characterized in that the piezoelectric vibrator according to the present invention is electrically connected to an integrated circuit as an oscillating element.

Still further, an electronic device according to the present invention is characterized in that the piezoelectric vibrator according to the present invention is electrically connected to a time counting part.

Still further, a radio-controlled timepiece according to the present invention is characterized in that the piezoelectric vibrator according to the present invention is electrically connected to a filter portion.

According to these inventions, the oscillator, the electronic device and the radio-controlled timepiece are provided with the piezoelectric vibrator which can be efficiently manufactured at a low cost and hence, a cost of the oscillator, the electronic device and the radio-controlled timepiece can be reduced.

According to the piezoelectric vibrator of the present invention, the piezoelectric vibrator can be manufactured efficiently leading to the reduction of cost of the piezoelectric vibrator.

Further, according to the manufacturing method of a piezoelectric vibrator of the present invention, the piezoelectric vibrator can be efficiently manufactured.

DETAILED DESCRIPTION OF THE PREFERRED EMBODIMENTS

Hereinafter, a piezoelectric vibrator according to one embodiment of the present invention is explained in conjunction with drawings.

As shown in FIG. 1 to FIG. 4, a piezoelectric vibrator 1 of this embodiment is a surface-mount-device piezoelectric vibrator which includes a tuning-fork-type piezoelectric vibrating piece 4, and a package 9 which houses the piezoelectric vibrating piece 4 therein.

Figure 3:
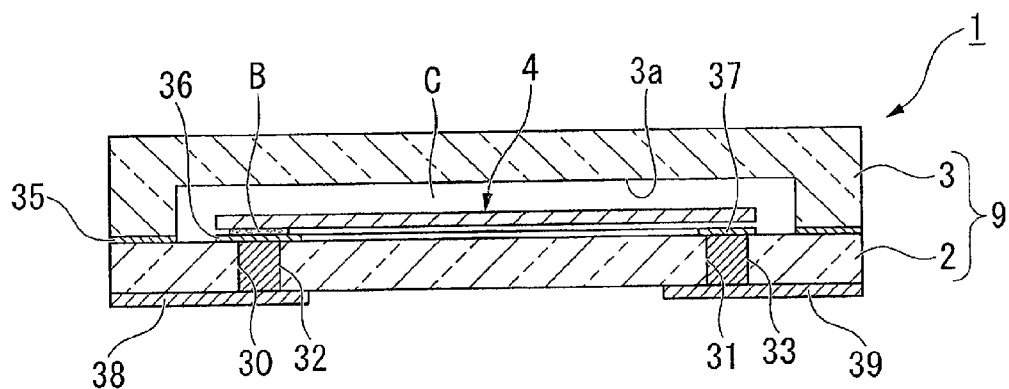
FIG. 3 is a cross-sectional view of a piezoelectric vibrator taking along a line A-A in FIG. 2.
Figure 4:
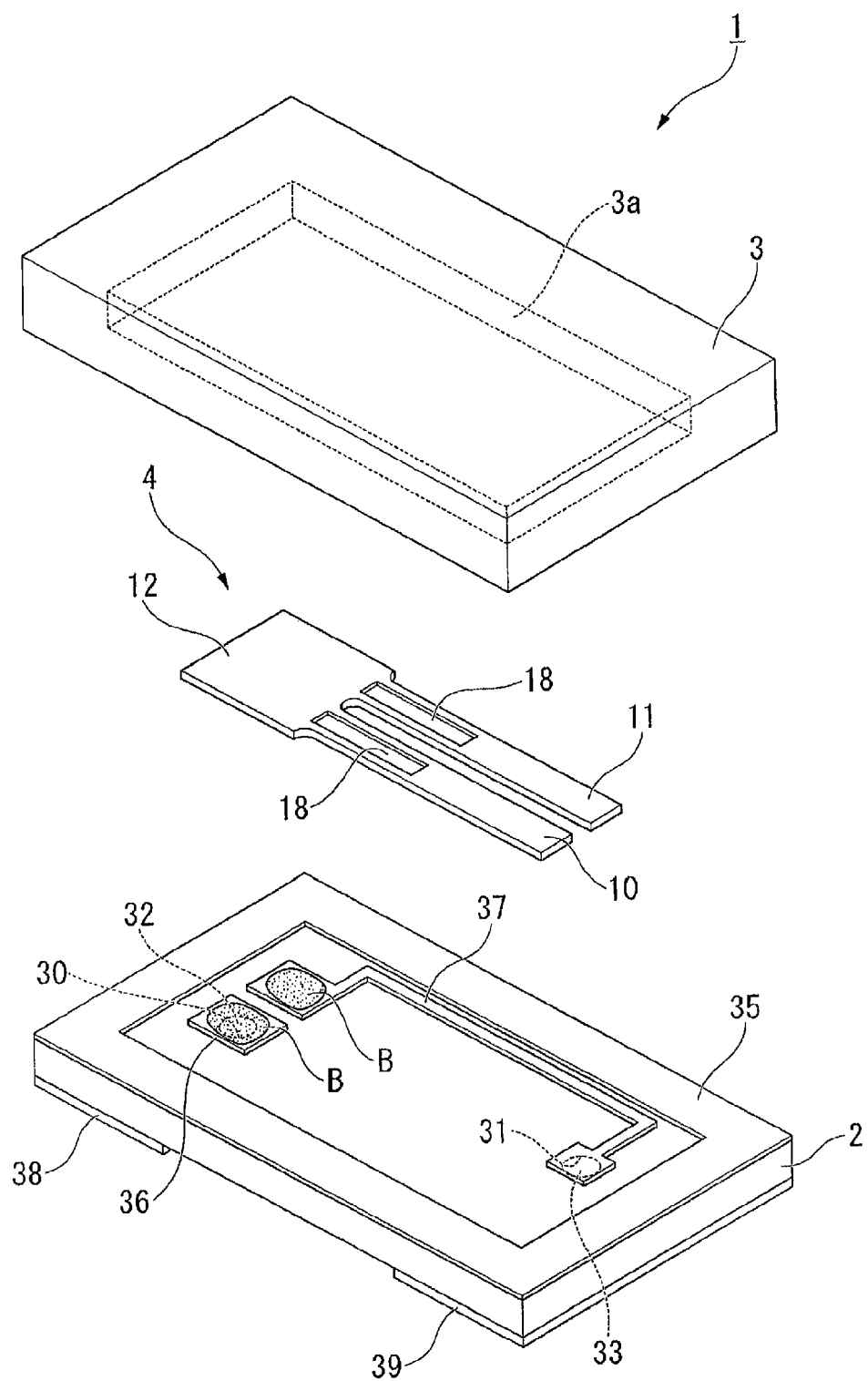
FIG. 4 is an exploded perspective view of the piezoelectric vibrator shown in FIG. 1.

Here, in FIG. 3 and FIG. 4, to facilitate understanding of the drawings, an excitation electrode 15, mount electrodes 16, 17, an insulation film 20, a weight metal film 21 and gettering films 74 of the piezoelectric vibrating piece 4 are omitted.

(Piezoelectric Vibrating Piece)

Figure 5:
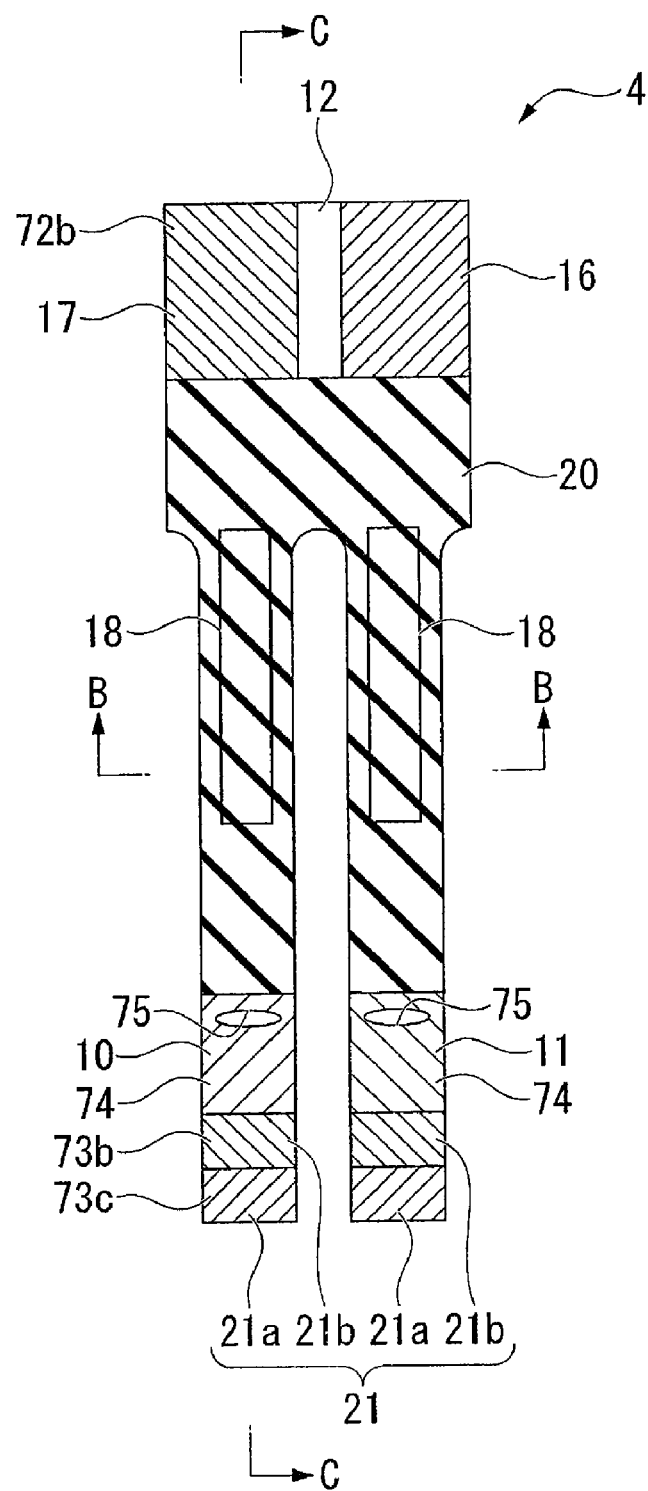
FIG. 5 is a top plan view of the piezoelectric vibrating piece which constitutes the piezoelectric vibrator shown in FIG. 1.
Figure 6:
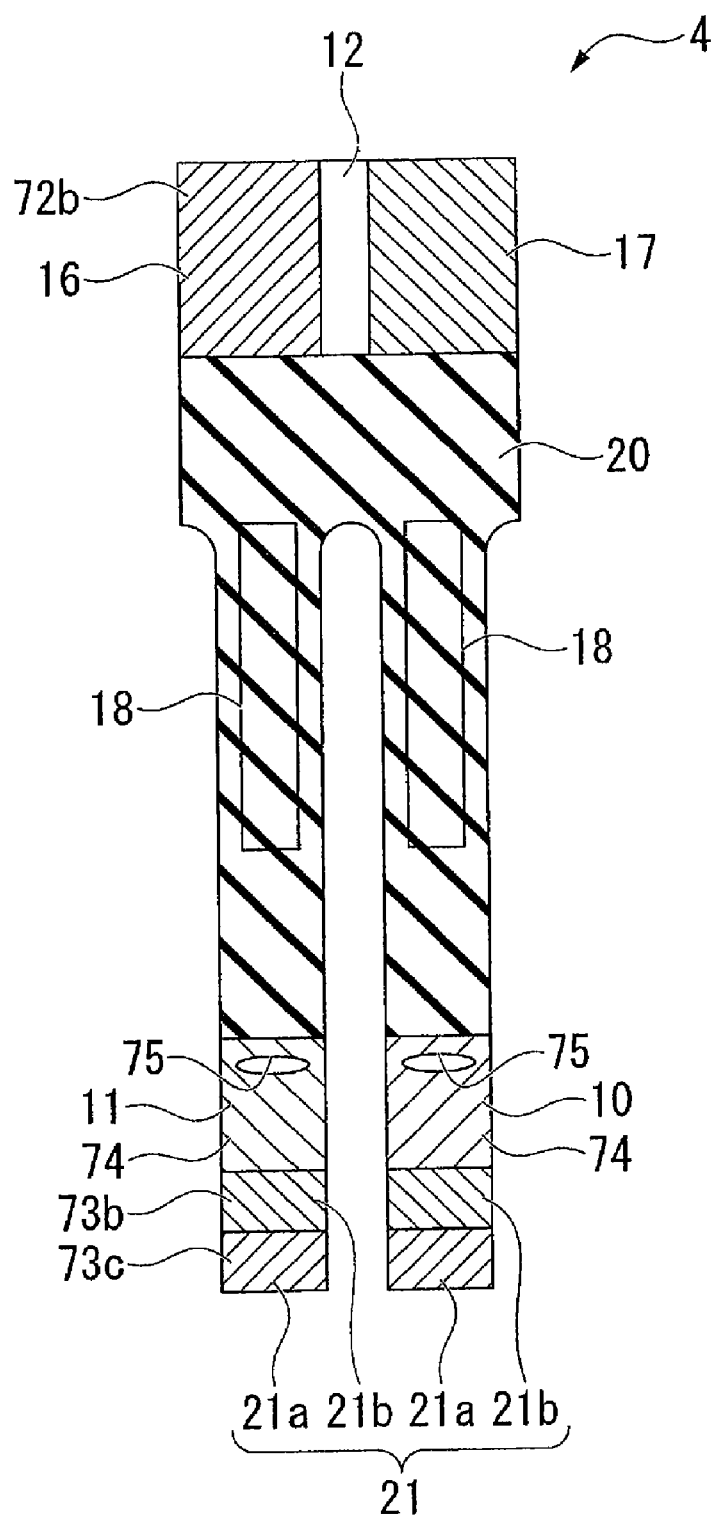
FIG. 6 is a bottom view of the piezoelectric vibrating piece shown in FIG. 5.
Figure 7:
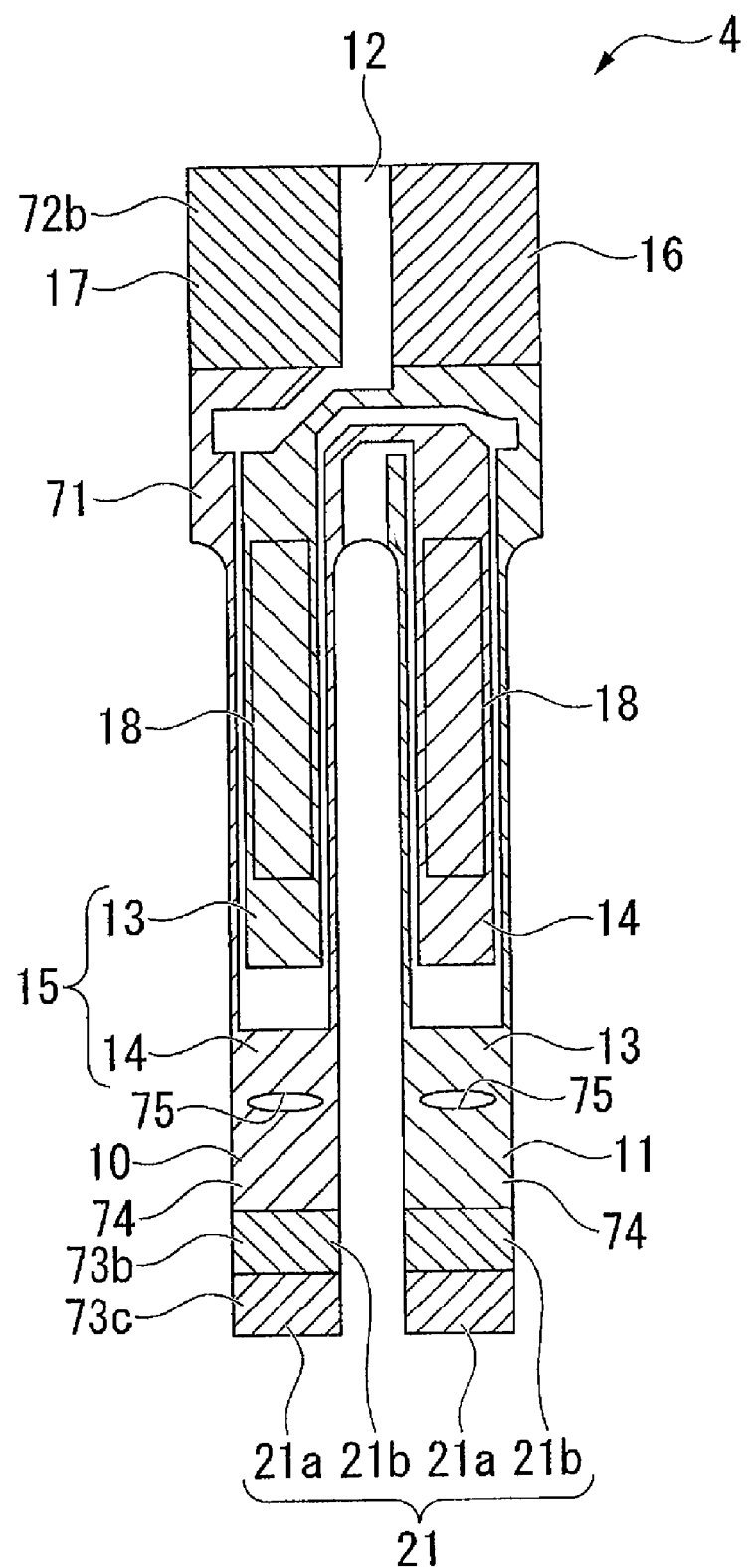
FIG. 7 is a top plan view of the piezoelectric vibrating piece shown in FIG. 5 in a state where an insulation film is removed.
Figure 8:
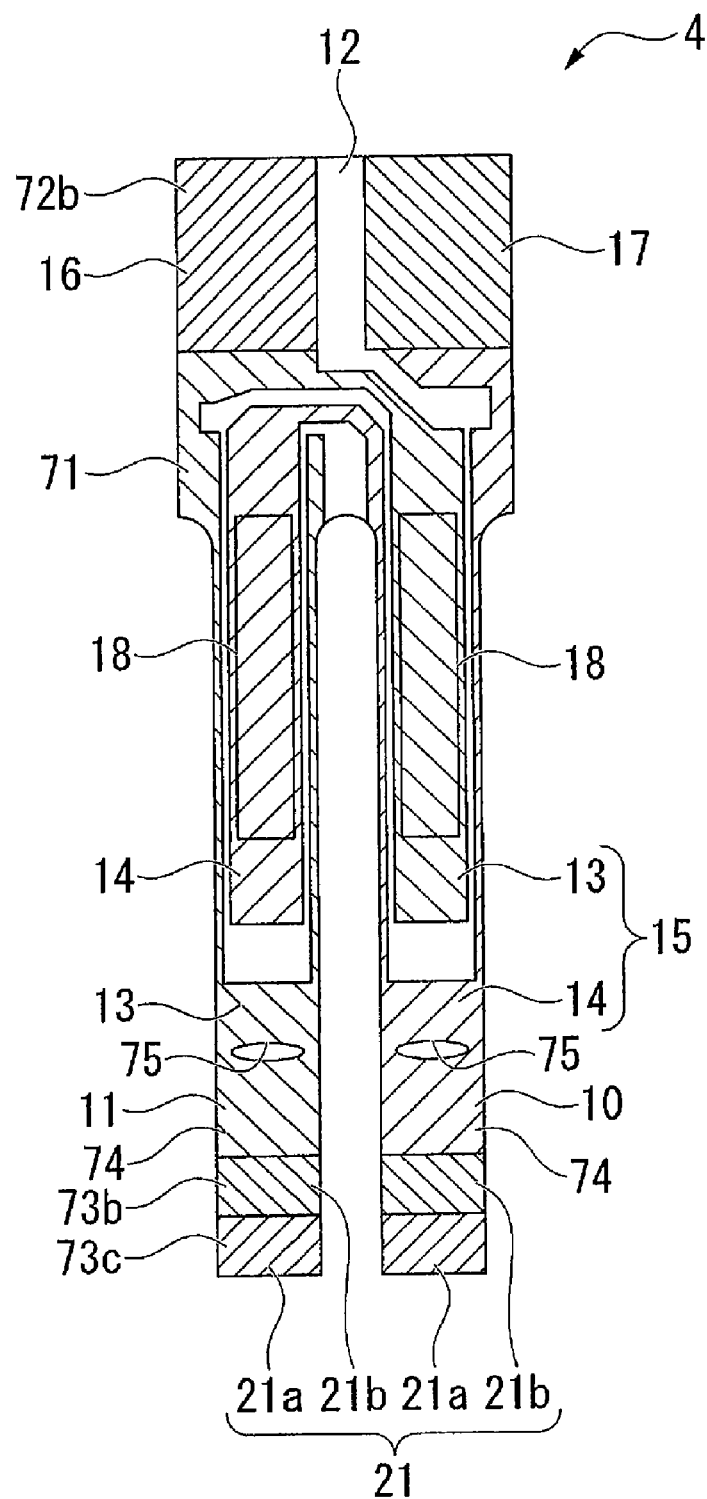
FIG. 8 is a bottom plan view of the piezoelectric vibrating piece shown in FIG. 6 in a state where an insulation film is removed.

As shown in FIG. 5 to FIG. 10, the piezoelectric vibrating piece 4 is a tuning-fork-type vibrating piece which is made of a piezoelectric material such as crystal, lithium tantalite, or lithium niobate, and the piezoelectric vibrating piece 4 is vibrated when a predetermined voltage is applied thereto. The piezoelectric vibrating piece 4 includes a pair of vibrating arm portions 10, 11 which is arranged parallel to each other, a base portion 12 to which base end portions of the pair of vibrating arm portions 10, 11 are integrally fixed, the excitation electrode 15 which is constituted of a first excitation electrode 13 and a second excitation electrode 14 which are formed on outer surfaces of the base end portions of the pair of vibrating arm portions 10, 11 so as to vibrate the pair of vibrating arm portions 10, 11, and the mount electrodes 16, 17 which are electrically connected to the first excitation electrode 13 and the second excitation electrode 14 respectively. Further, the piezoelectric vibrating piece 4 includes groove portions 18 which are formed on both main surfaces of the pair of vibrating arm portions 10, 11 respectively along the longitudinal direction of the vibrating arm portions 10, 11. The groove portion 18 extends from a base end side to the vicinity of an intermediate portion of the vibrating arm portion 10, 11. FIG. 7 and FIG. 8 show a state where the insulation film 20 is removed from the piezoelectric vibrating piece 4.

Figure 9:
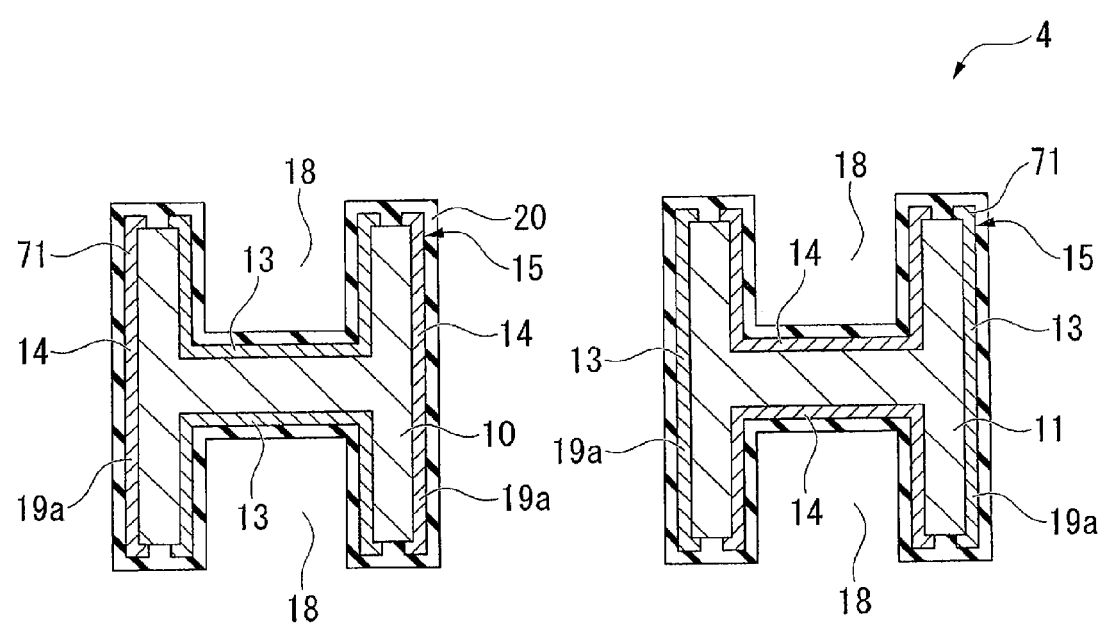
FIG. 9 is a cross-sectional view taken along a line B-B in FIG. 5.

As shown in FIG. 7 to FIG. 9, the excitation electrode 15 which is constituted of the first excitation electrode 13 and the second excitation electrode 14 is an electrode for vibrating the pair of vibrating arm portions 10, 11 in the direction that the vibrating arm portions 10, 11 approach to each other or are separated from each other with predetermined resonance frequency. The first excitation electrode 13 and the second excitation electrode 14 are formed on the outer surfaces of the pair of vibrating arm portions 10, 11 by patterning in a state where the first excitation electrode 13 and the second excitation electrode 14 are electrically separated from each other. To be more specific, the first excitation electrode 13 is mainly formed on the groove portions 18 of one vibrating arm portion 10 and on both side surfaces of the other vibrating arm portion 11, while the second excitation electrode 14 is mainly formed on both side surfaces of one vibrating arm portion 10 and on the groove portions 18 of the other vibrating arm portion 11. Here, in the example shown in the drawings, the excitation electrode 15 is formed on an outer surface of an electrode region ranging from the base end portions of the pair of vibrating arm portions 10, 11 to vibrating-arm-portion-10, 11-side portions of the base portion 12 along the longitudinal direction of the piezoelectric vibrating piece 4.

Further, the first excitation electrode 13 and the second excitation electrode 14 are electrically connected to the mount electrodes 16, 17 respectively on both main surfaces of the base portions 12, and a voltage is applied to the piezoelectric vibrating piece 4 via the mount electrodes 16, 17.

Further, as shown in FIG. 5 and FIG. 6, the excitation electrode 15 is covered with the insulation film 20. The insulation film 20 is formed on an outer surface of the above-mentioned electrode region, that is, on an outer surface of the region where the excitation electrode 15 is positioned in the longitudinal direction of the piezoelectric vibrating piece 4 on the vibrating arm portions 10, 11 and the base portion 12 from the outside of the excitation electrode 15. In the example shown in the drawings, the insulation film 20 is formed on the whole area of the electrode region.

Further, a weight metal film 21 is formed on distal end portions of the pair of vibrating arm portions 10, 11 respectively. The weight metal film 21 is provided to perform the mass adjustment (frequency adjustment) such that the vibrating arm portions 10, 11 are vibrated in a vibration state where the vibrations fall within a predetermined frequency range. Here, the weight metal film 21 is formed of a coarse adjustment film 21a which is used for coarsely adjusting the frequency and a fine adjustment film 21b which is used for finely adjusting the frequency. By performing the frequency adjustment using the coarse adjustment film 21a and the fine adjustment film 21b, it is possible to make the frequency of the pair of vibrating arm portions 10, 11 fall within a range of nominal (target) frequency of the device.

Figure 10:
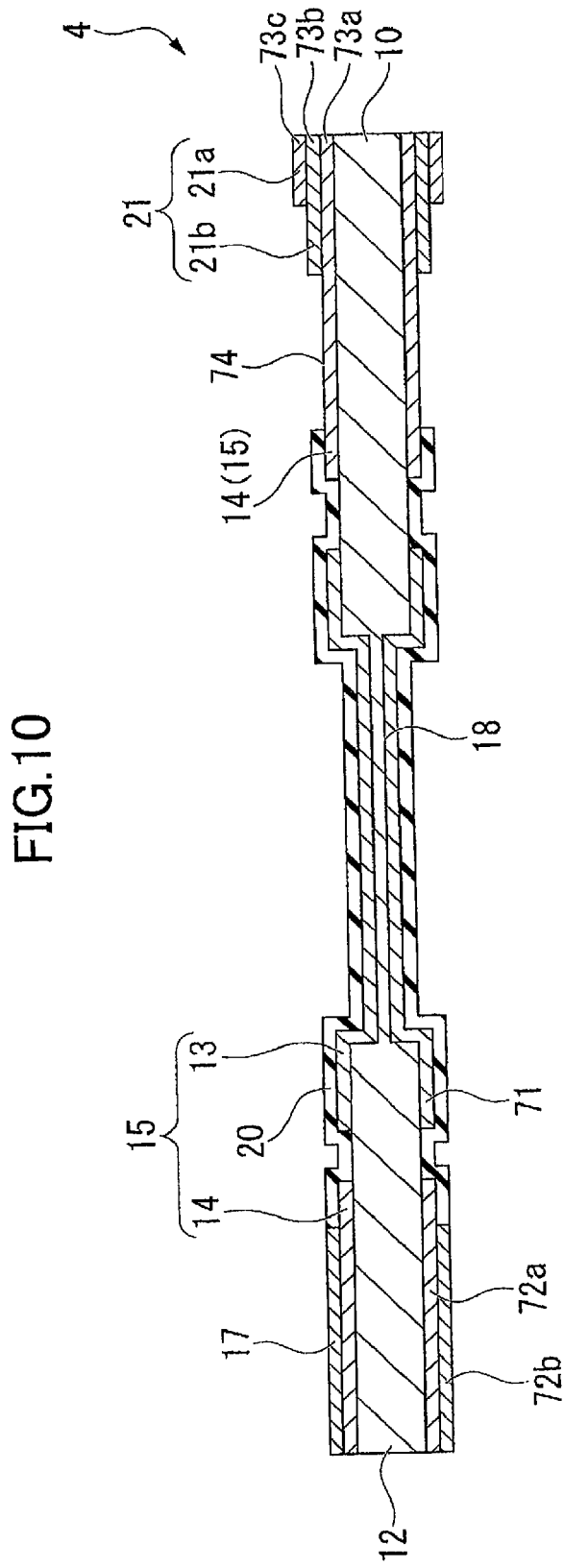
FIG. 10 is a cross-sectional view taken along a line C-C in FIG. 5.

Further, as shown in FIG. 10, the excitation electrode 15 is formed of a single-layered metal layer (first metal film) 71 which is formed on the outer surfaces of the vibrating arm portions 10, 11 (electrode regions). Further, the mount electrodes 16, 17 are respectively formed of a background layer 72a which is formed on the outer surfaces of the vibrating arm portions 10, 11 and the base portion 12 and a finishing layer 72b which is stacked on the background layer 72a. Further, in this embodiment, the metal layer 71 which forms the excitation electrode 15 and the background layers 72a which forms the mount electrodes 16, 17 are continuously and integrally formed with each other using the same material.

Further, the weight metal film 21 includes a first weight layer (second metal film) 73a which is formed on the whole peripheries of the outer surfaces of the distal end portions of the vibrating arm portions 10, 11, a second weight layer 73b which is stacked on the first weight layer 73a, and a third weight layer 73c which is stacked on the second weight layer 73b on a distal-end side of the vibrating arm portions 10, 11. A portion of the weight metal film 21 where the first weight layer 73a, the second weight layer 73b and the third weight layer 73c are stacked in three layers constitutes the coarse adjustment film 21a, and a portion of the weight metal film 21 where the first weight layer 73a and the second weight layer 73b are stacked in two layers constitutes the fine adjustment film 21b.

Here, in the example shown in the drawings, the third weight layer 73c is stacked on the second weight layer 73b on a distal-end side and both main-surface-sides of the vibrating arm portions 10, 11. Further, a portion of the second weight layer 73b is exposed in the inside of the cavity C.

As shown in FIG. 5, FIG. 6 and FIG. 10, on an intermediate portion between the base end portion and the distal end portion in each vibrating arm portion 10, 11, a gettering film 74 on which a laser radiation flaw 75 is formed is formed.

The gettering film 74 is formed on an outer surface of the intermediate portion of the vibrating arm portion 10, 11 and is exposed in the inside of the cavity C.

Further, as shown in FIG. 5 and FIG. 6, the laser radiation flaw 75 is formed on the gettering film 74 on both main-surface sides of the respective vibrating arm portions 10, 11. The laser radiation flaw 75 is formed by radiating laser beam to the gettering film 74 so as to remove the gettering film 74 by evaporation. For example, when a laser beam is radiated to a point of the gettering film 74 (point radiation), the laser radiation flaw 75 having a bowl shape is formed. On the other hand, when a point radiation is repeated at short intervals while scanning a laser beam, the laser radiation flaw 75 having a groove shape is formed. Here, in FIG. 10, for facilitating the understanding of the drawings, the laser radiation flaw 75 is omitted.

Further, in this embodiment, as shown in FIG. 10, the metal layer 71 of the excitation electrode 15, the first weight layer 73a of the weight metal film 21 and the gettering film 74 are formed using the same material. These metal layer 71, the first weight layer 73a and the gettering film 74 are made of any one of materials which are activated by laser radiation and absorb a gas in ambient atmosphere, for example, any one of chromium, titanium, vanadium, and zirconium. In the example shown in the drawing, the metal layer 71, the first weight layer 73a and the gettering film 74 are made of chromium, and have the same thickness (for example, 500 to 1000 angstrom).

Further, in this embodiment, the gettering film 74 is formed on the whole area of the intermediate portion. That is, the gettering film 74 is continuously formed between the excitation electrode 15 and the weight metal film 21 and, at the same time, is integrally formed with the metal layer 71 and the first weight layer 73a.

In this embodiment, the finishing layer 72b of the mount electrodes 16, 17 and the second weight layer 73b of the weight metal film 21 are formed using the same material. The finishing layer 72b and the second weight layer 73b are made of gold, for example, and have the same thickness.

Further, in the example shown in the drawing, the insulation film 20 is made of silicon dioxide, for example, and the third weight layer 73c of the weight metal film 21 is made of gold, for example.

The piezoelectric vibrating piece 4 having such a constitution is, as shown in FIG. 3 and FIG. 4, bonded to a base-substrate-2 side of the package 9 described later using a bump B such as gold by bump bonding. To be more specific, the bump bonding of the piezoelectric vibrating piece 4 is made in a state where the pair of mount electrodes 16, 17 is brought into contact with two bumps B which are formed on routing electrodes 36, 37 described later which are formed on an upper surface (an inner surface or a bonding surface to which the lid substrate 3 is bonded) of the base substrate 2 by patterning. Due to such a constitution, the piezoelectric vibrating piece 4 is supported in a state where the piezoelectric vibrating piece 4 floats from the upper surface of the base substrate 2 and, at the same time, the mount electrodes 16, 17 and the routing electrodes 36, 37 are respectively electrically connected with each other.

(Piezoelectric Vibrator)

As shown in FIG. 1 to FIG. 4, the package 9 includes the base substrate 2 and the lid substrate 3 which overlap with each other with the cavity C formed therebetween.

Figure 1:
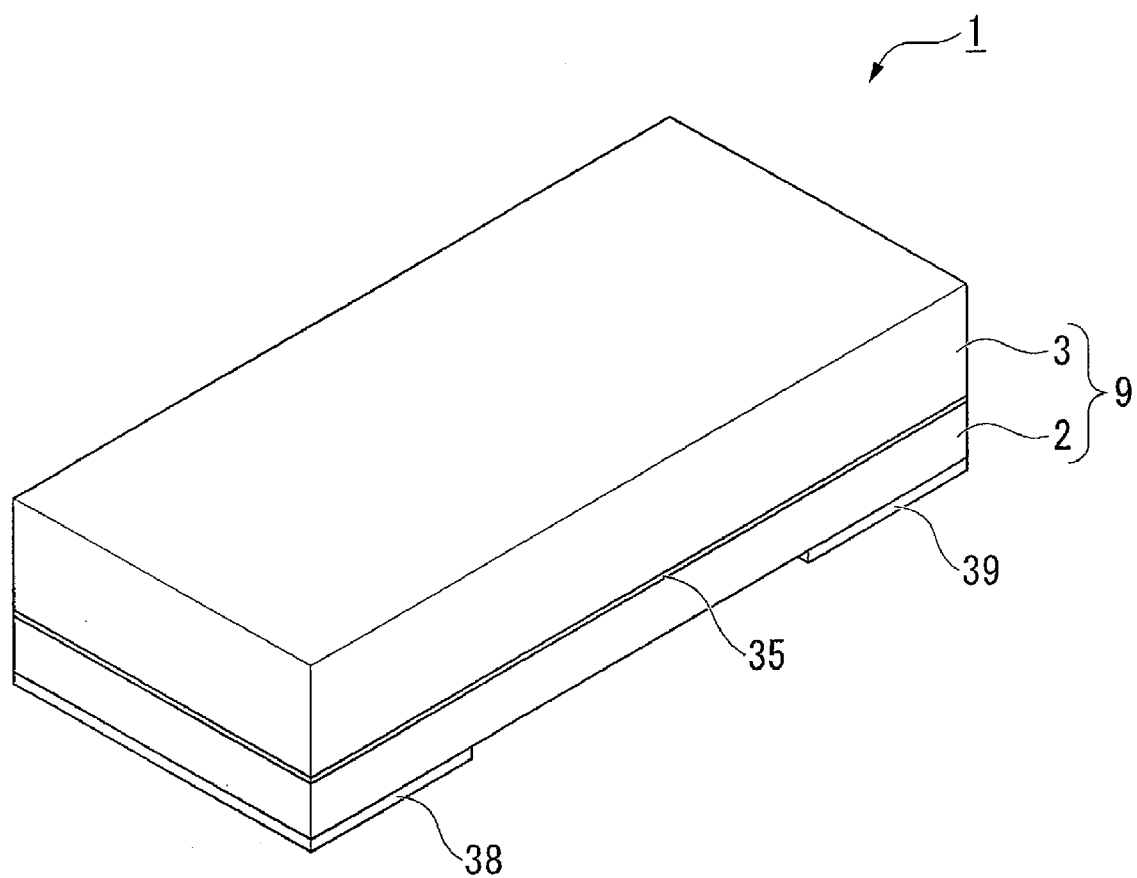
FIG. 1 is an appearance perspective view showing one embodiment of a piezoelectric vibrator of the present invention.

The lid substrate 3 is a transparent insulation substrate made of a glass material such as soda-lime glass, for example, and has a plate shape as shown in FIG. 1, FIG. 3 and FIG. 4. Further, on a lower surface (inner surface, a bonding surface to which the base substrate 2 being bonded) of the lid substrate 3, a rectangular-shaped recessed portion 3a in which the piezoelectric vibrating piece 4 is housed is formed. The recessed portion 3a is a cavity-forming recessed portion which form the cavity C for housing the piezoelectric vibrating piece 4 when both substrates 2, 3 are made to overlap with each other. Further, the lid substrate 3 is bonded to the base substrate 2 by anode-bonding in a state where the recessed portion 3a faces the base substrate 2 in an opposed manner.

The base substrate 2 is, in the same manner as the lid substrate 3, a transparent insulation substrate made of a glass material such as soda-lime glass, for example, and as shown in FIG. 1 to FIG. 4, has a plate shape with a size where the base substrate 2 can be overlapped to the lid substrate 3.

Figure 2:
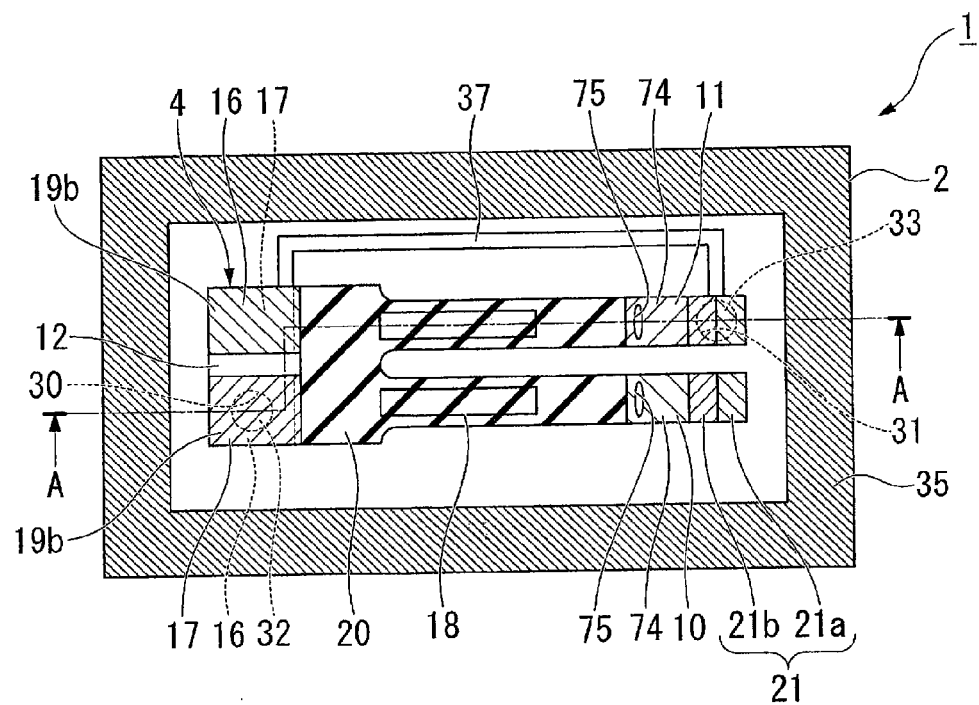
FIG. 2 is an internal constitutional view of the piezoelectric vibrator shown in FIG. 1 and is a view of a piezoelectric vibrating piece as viewed from above in a state where a lid substrate is removed.

As shown in FIG. 2 and FIG. 3, a pair of through holes (penetration holes) 30, 31 which penetrates the base substrate 2 is formed in the base substrate 2. The pair of through holes 30, 31 is formed on both ends on a diagonal line of the cavity C. Further, a pair of penetration electrodes 32, 33 is formed in the pair of through holes 30, 31 so as to embed the through holes 30, 31. These penetration electrodes 32, 33 are made of a conductive material such as an Ag paste. On a lower surface (outer surface) of the base substrate 2, a pair of outer electrodes 38, 39 which is electrically connected to the pair of penetration electrodes 32, 33 is formed.

As shown in FIG. 2 and FIG. 4, an anode-bonding-use bonding film 35 and a pair of routing electrodes 36, 37 are formed on the upper surface of the base substrate 2 by patterning. Here, the bonding film 35 is made of a conductive material such as aluminum, for example, and is formed along a periphery of the base substrate 2 so as to surround a periphery of the recessed portion 3a formed in the lid substrate 3.

The pair of routing electrodes 36, 37 is formed of an electrode film having the two-layered structure consisting of a lower layer made of chromium and an upper layer made of gold, for example. As shown in FIG. 2 to FIG. 4, the pair of routing electrodes 36, 37 are formed by patterning such that one routing electrode 36 electrically connects one penetration electrode 32 and one mount electrode 16 of the piezoelectric vibrating piece 4 with each other, and the other routing electrode 37 electrically connects the other penetration hole 33 and the other mount electrode 17 of the piezoelectric vibrating piece 4.

Further, on a lower surface of the base substrate 2, as shown in FIG. 1, FIG. 3 and FIG. 4, the outer electrodes 38, 39 which are electrically connected with the pair of penetration electrodes 32, 33 respectively are formed. That is, one outer electrode 38 is electrically connected to the first excitation electrode 13 of the piezoelectric vibrating piece 4 through one penetration electrode 32 and one routing electrode 36. Further, the other outer electrode 39 is electrically connected to the second excitation electrode 14 of the piezoelectric vibrating piece 4 through the other penetration electrode 33 and the other routing electrode 37. As a result, the pair of excitation electrodes 15 can be electrically connected with the outside of the cavity C respectively.

In operating the piezoelectric vibrator 1 having such a constitution, a predetermined drive voltage is applied to the outer electrodes 38, 39 formed on the base substrate 2. Due to such applying of the drive voltage, it is possible to allow an electric current to flow into the pair of excitation electrodes 15 of the piezoelectric vibrating piece 4 consisting of the first excitation electrode 13 and the second excitation electrode 14 thus vibrating the pair of vibrating arm portions 10, 11 in the direction that the vibrating arm portions 10, 11 approach to each other or are separated from each other with predetermined frequency. By making use of the vibrations of the pair of vibrating arm portions 10, 11, the piezoelectric vibrator 1 can be used as a time source, a timing source of a control signal, a reference signal source or the like.

(Manufacturing Method of Piezoelectric Vibrator)

Figure 11:
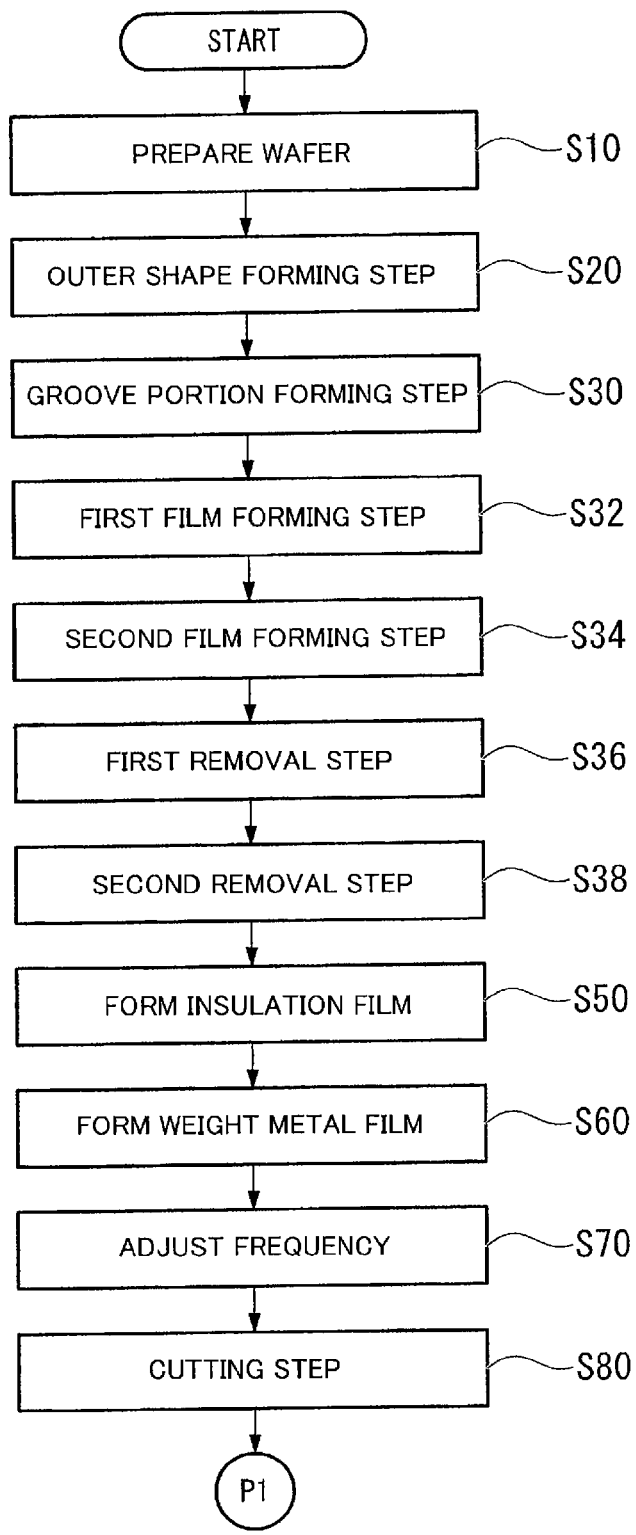
FIG. 11 is a flowchart showing a flow in manufacturing the piezoelectric vibrating piece shown in FIG. 1.

Next, a method of manufacturing a plurality of above-mentioned piezoelectric vibrators 1 at a time by making use of a base substrate forming wafer (base substrate) 40 and a lid substrate forming wafer (lid substrate) 50 is explained hereinafter in conjunction with flowcharts shown in FIG. 11 and FIG. 12 respectively. Although the plurality of piezoelectric vibrators 1 are manufactured at a time by making use of a wafer-shaped substrate in this embodiment, the present invention is not limited to such a case. For example, substrates which conform to outer shapes of the base substrate 2 and the lid substrate 3 may be formed preliminarily, and only one piezoelectric vibrator 1 may be manufactured at a time.

Firstly, in a piezoelectric-vibrating piece preparation step, the piezoelectric vibrating piece 4 shown in FIG. 5 to FIG. 10 is prepared.

Figure 13:
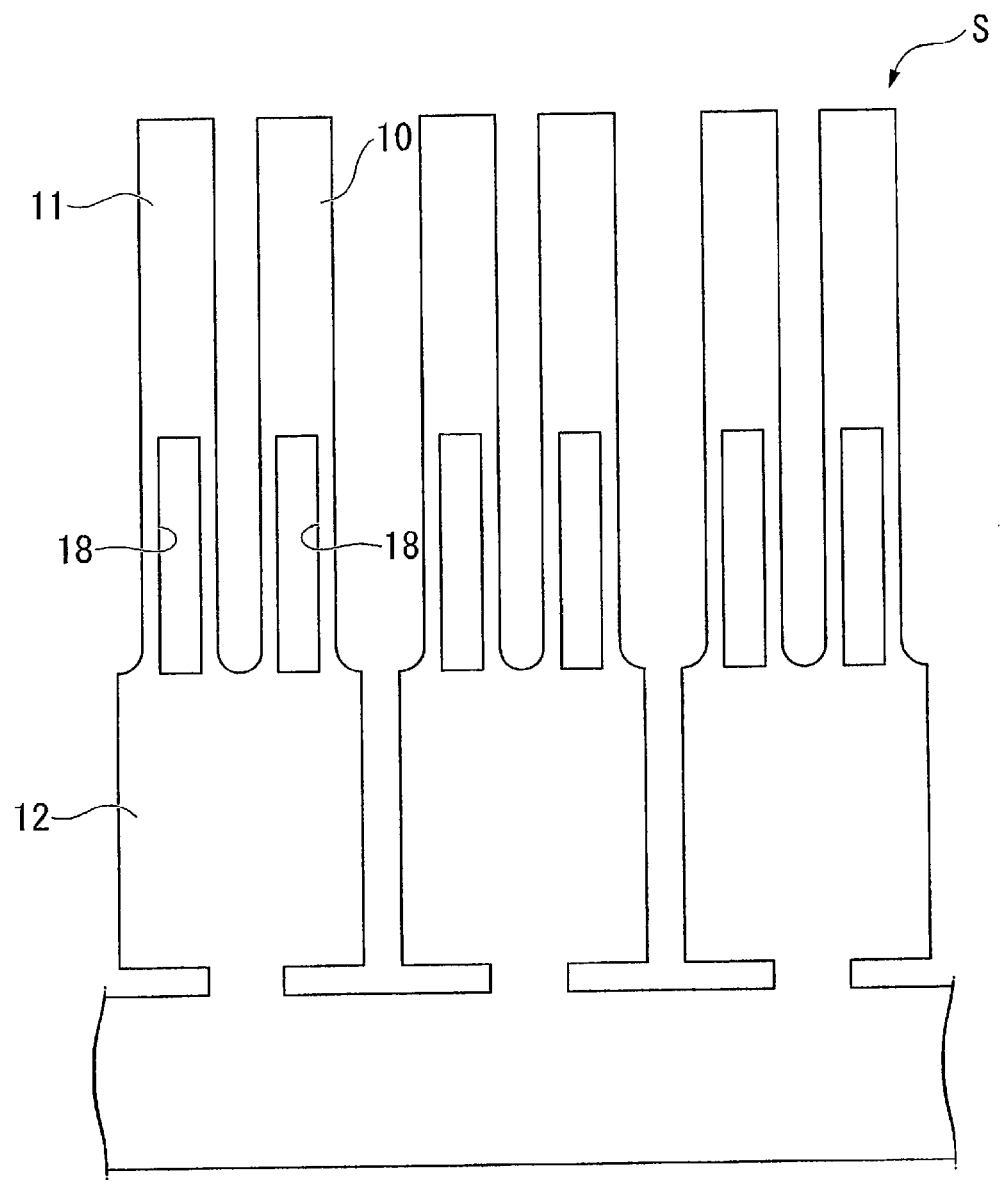
FIG. 13 is a view showing one step in manufacturing the piezoelectric vibrator along the flowchart shown in FIG. 11 and FIG. 12 and a view showing a state where an external shape of a piezoelectric vibrating piece and groove portion are formed in a wafer.

To be more specific, as shown in FIG. 13, a wafer having a predetermined thickness is firstly formed by slicing a Lambert crystal ore at a predetermined angle. Next, the wafer is subject to rough working by lapping and, thereafter, a layer of the wafer degenerated by working is removed by etching. Then, the wafer is subject to mirror-polish working such as polishing to form a wafer S having a predetermined thickness (S10).

Next, in an outer shape forming step, the wafer S obtained by polishing is etched by a photolithography technique or the like thus patterning outer shapes of a plurality of piezoelectric vibrating pieces 4 (S20). Due to such a process, outer shapes of a pair of vibration arm portions 10, 11 and the base portion 12 are formed on the wafer S in plural. Next, in this embodiment, in a groove portion forming step, the groove portions 18 are formed on the pair of respective vibration arm portions 10, 11 by a photolithography technique or the like (S30).

Figure 14:
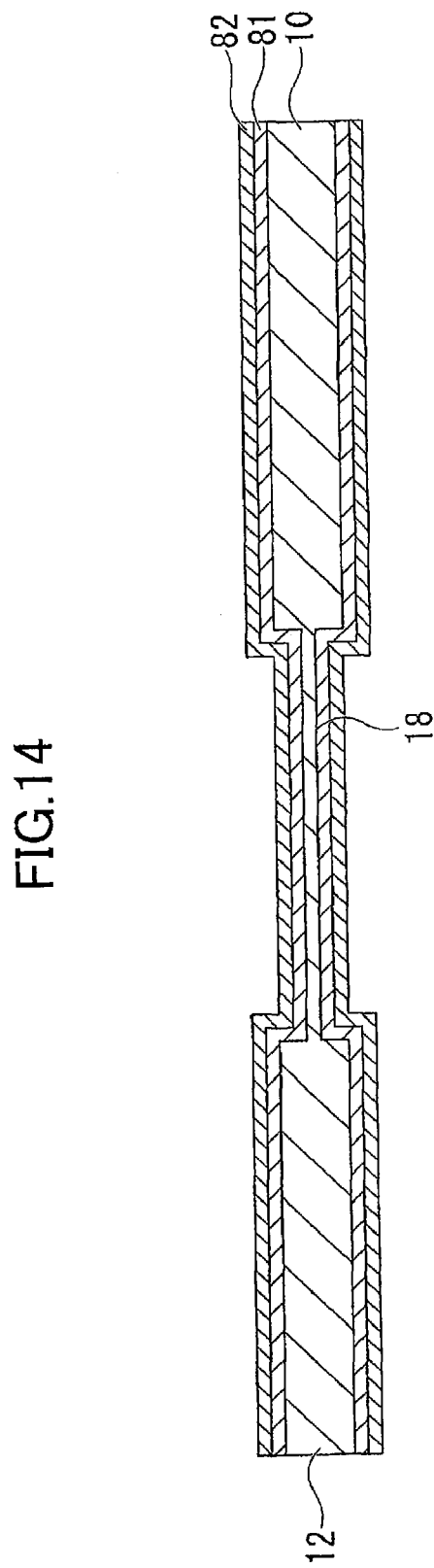
FIG. 14 is a view showing one step in manufacturing the piezoelectric vibrator along the flowchart shown in FIG. 11 and FIG. 12 and is a view showing a state where a first film and a second film are formed on the wafer.

Next, as shown in FIG. 14, in a first film forming step, a first film 81 which becomes the metal layer 71 of the excitation electrode 15, the background layers 72a of the mount electrodes 16, 17, the first weight layer 73a of the weight metal film 21, and the gettering film 74 is formed on outer surfaces of the vibration arm portions 10, 11 (S32). In this embodiment, the first film 81 is formed on the whole area of the outer surfaces of the vibration arm portions 10, 11 and the base portion 12 except for end surfaces thereof in the longitudinal direction by sputtering chromium, for example.

Then, in a second film forming step, a second film 82 which becomes the finishing layers 72b of the mount electrodes 16, 17 and the second weight layer 73b of the weight metal film 21 is formed on the first film 81 by stacking (S34). In this embodiment, the second film 82 is formed by sputtering gold, for example.

Figure 15:
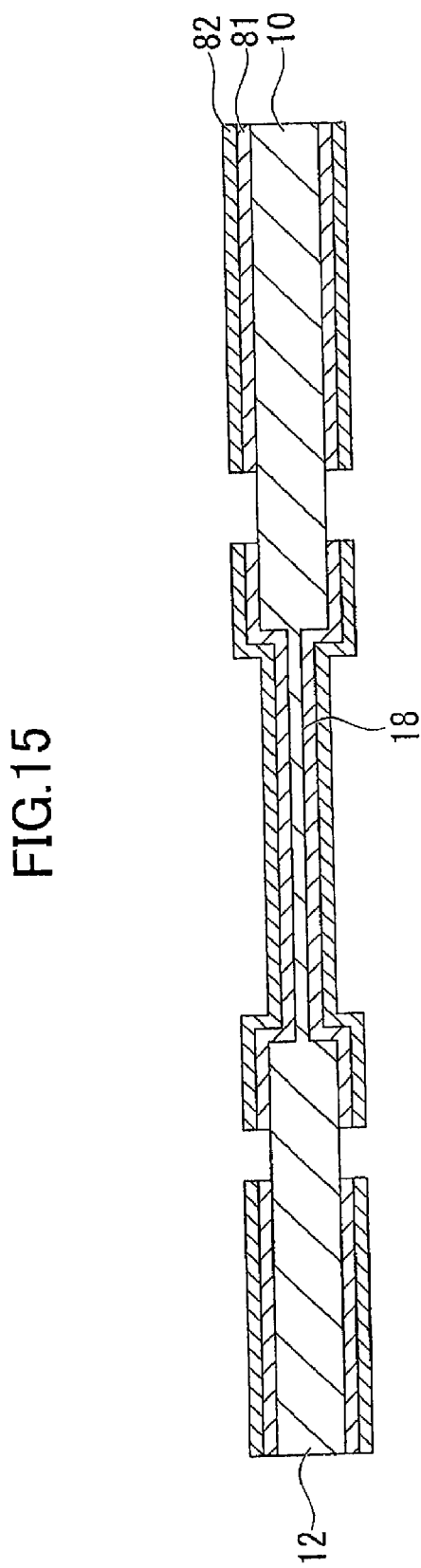
FIG. 15 is a view showing one step in manufacturing the piezoelectric vibrator along the flowchart shown in FIG. 11 and FIG. 12 and is a view showing a state of the wafer after finishing a first removing step.

Next, as shown in FIG. 15, in a first removal step, portions of the first film 81 and the second film 82 positioned in regions different from regions where the excitation electrodes 15, the mount electrodes 16, 17, the weight metal film 21 and the gettering film 74 are formed are removed (S36).

In this step, firstly, a photoresist film which becomes a mask in etching (not shown in the drawing) is formed from the outside of the second film 82 by spray coating or the like and, thereafter, the photoresist film is patterned by a photolithography technique. Here, the photoresist film is patterned such that the photoresist film remains in regions where the excitation electrodes 15, the mount electrodes 16, 17, the weight metal film 21 and the gettering film 74 are formed. Next, the first film 81 and the second film 82 are etched using the photoresist film as a mask, and portions of the first film 81 and the second film 82 which are positioned in regions different from the regions where the excitation electrodes 15, the mount electrodes 16, 17, the weight metal film 21 and the gettering film 74 are formed are removed.

Figure 16:
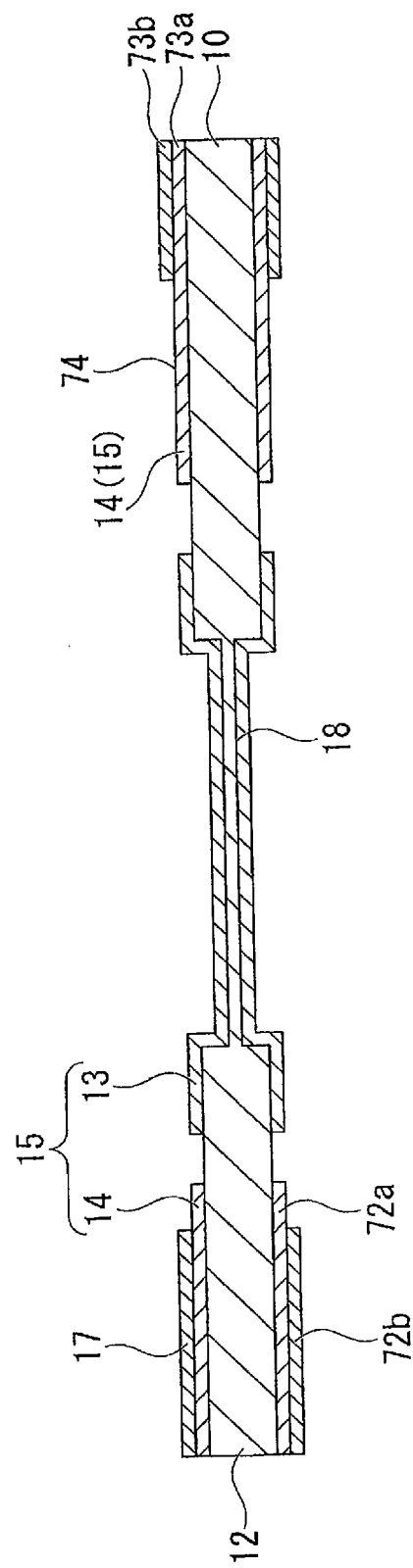
FIG. 16 is a view showing one step in manufacturing the piezoelectric vibrator along the flowchart shown in FIG. 11 and FIG. 12 and is a view showing a state of the wafer after finishing a second removing step.

Next, as shown in FIG. 16, in a second removal step, portions of the second film 82 positions in regions different from regions where the mount electrodes 16, 17 and the weight metal film 21 are formed are removed (S38).

In this step, firstly, a photoresist film which becomes a mask in etching (not shown in the drawing) is formed from the outside of the second film 82 by spray coating or the like and, thereafter, the photoresist film is patterned by a photolithography technique. Here, the photoresist film is patterned such that the photoresist film remains in regions where the mount electrodes 16, 17 and the weight metal film 21 are formed.

Next, the second film 82 is etched using the photoresist film as a mask, and portions of the second film 82 which are positioned in regions different from the regions where the mount electrodes 16, 17 and the weight metal film 21 are formed are removed.

By performing the first film forming step, the second film forming step, the first removal step and the second removable step described above, the metal layer 71 of the excitation electrode 15, the first weight layer 73a of the weight metal film 21, and the gettering film 74 are simultaneously formed on the vibration arm portions 10, 11. Further, in this embodiment, by performing the first film forming step, the second film forming step, the first removal step and the second removable step, the finishing layers 72b of the mount electrodes 16, 17 and the second weight layer 73b of the weight metal film 21 are simultaneously formed.

Next, in an insulation film forming step, the insulation film 20 is formed on the vibration arm portions 10, 11 and the base portion 12 so as to cover the pair of excitation electrode 15 (S50). Here, the insulation film 20 is formed by forming a film made of silicon dioxide on the outer surface of the electrode region by a thermal CVD method from the outside of the excitation electrode 15, for example.

Further, the third weight layer 73c is formed on the second weight layer 73b by vapor-depositing gold, for example, thus forming the weight metal film 21 (S60).

After forming the insulation film 20 and the weight metal film 21, as a coarse adjustment step, resonance frequency of the respective piezoelectric vibrating pieces 4 is coarsely adjusted (S70). Here, a laser beam is radiated to a coarse adjustment film of the weight metal film 21 and hence, a weight applied to the distal ends of the pair of vibration arm portions 10, 11 is reduced whereby the frequency is coarsely adjusted. The fine adjustment of the resonance frequency which adjusts the resonance frequency more accurately is performed after mounting of the piezoelectric vibrating pieces 4. This fine adjustment is explained later.

Next, in a cutting step, connection portions which connect the wafer S and the piezoelectric vibrating pieces 4 are cut thus separating the piezoelectric vibrating pieces 4 from the wafer S as small pieces (S80). Accordingly, it is possible to manufacture a plurality of piezoelectric vibrating pieces 4 from one sheet of wafer S at a time.

The piezoelectric-vibrating piece preparation step is finished with the above-mentioned processing.

Figure 17:
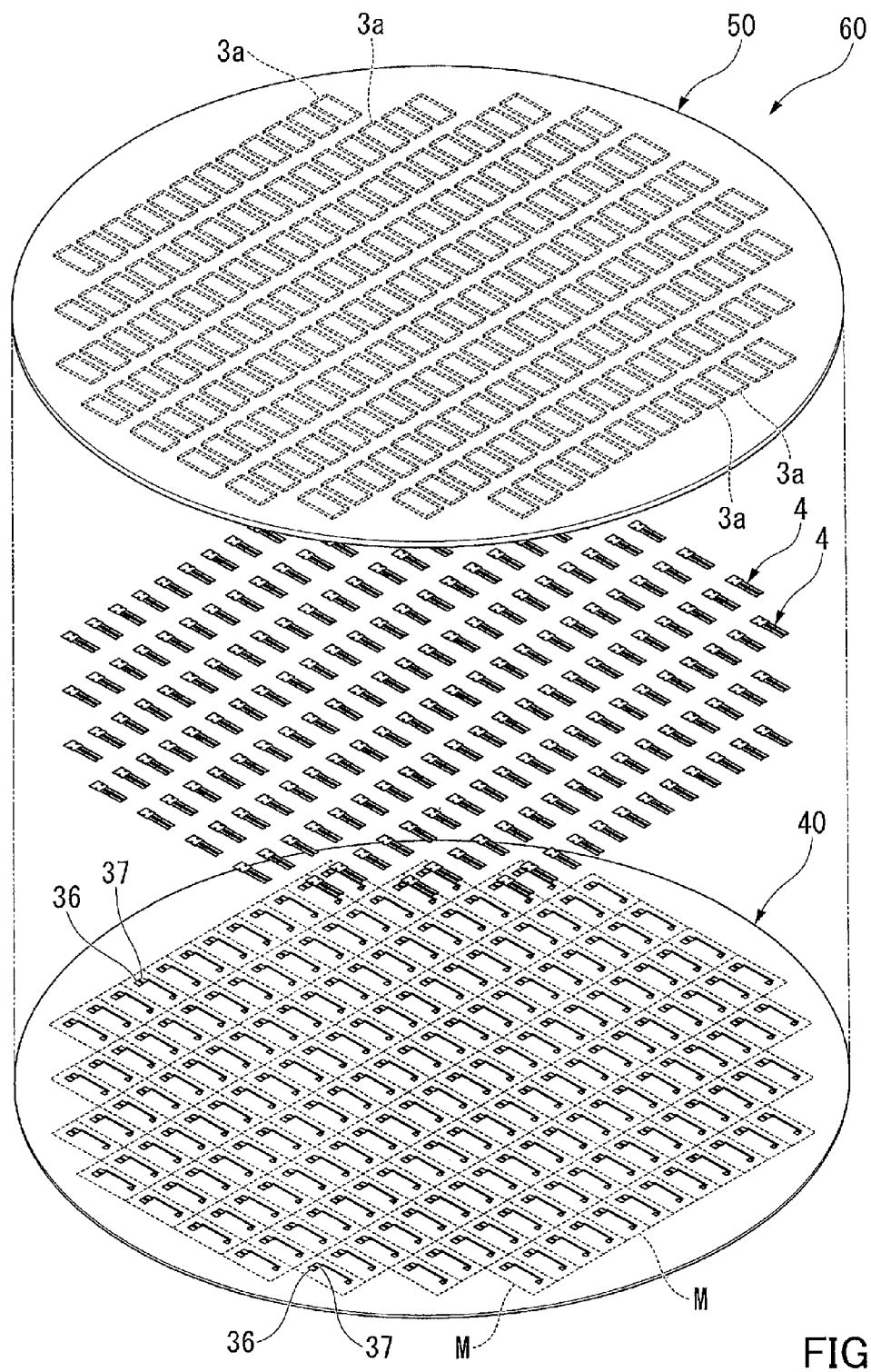
FIG. 17 is a view showing one step in manufacturing the piezoelectric vibrator along the flowchart shown in FIG. 11 and FIG. 12 and is an exploded perspective view of a wafer body in which a base substrate forming wafer and a lid substrate forming wafer are anode-bonded in a state that the piezoelectric vibrating piece is housed in the inside of a cavity.

Next, as shown in FIG. 17, simultaneously with or at timing before and after the piezoelectric-vibrating piece preparation step, in a first wafer preparation step, a lid substrate forming wafer 50 which becomes the lid substrate 3 later is prepared in a state immediately before bonding the lid substrate 3 to the base substrate 2 by anode-bonding (S90). Firstly, soda lime glass is polished to a predetermined thickness and is cleaned and, thereafter, a working degeneration layer which constitutes an outermost surface is removed by etching or the like thus forming a disc-shaped lid substrate forming wafer 50 (S91). Next, in a recessed portion forming step, on a lower surface of the lid substrate forming wafer 50, a plurality of recessed portions 3a for cavities are formed in the row direction as well as in the columnar direction by etching or the like (S92). At this point of time, the first wafer preparation step is finished.

Next, as shown in FIG. 17, simultaneously with or at timing before and after the first wafer preparation step, in a second wafer preparation step, a base substrate forming wafer 40 which becomes the base substrate 2 later is prepared in a state immediately before bonding the base substrate 2 to the lid substrate 3 by anode-bonding (S100). Firstly, soda lime glass is polished to a predetermined thickness and is cleaned and, thereafter, a working degeneration layer which constitutes an outermost surface is removed by etching or the like thus forming a disc-shaped base substrate forming wafer 40 (S101).

Next, in a penetration electrode forming step, a plurality of pairs of penetration electrodes 32, 33 are formed in the base substrate forming wafer 40 (S102). Here, for example, after forming the plurality of pairs of through holes 30, 31 which penetrate the base substrate forming wafer 40 by a method such as a sandblast method, press forming method or the like, pairs of penetration electrodes 32, 33 are formed in the inside of the plurality of through holes 30, 31 respectively. Due to the formation of the pairs of penetration electrodes 32, 33, the electric conductivity between an upper surface side and a lower surface side of the base substrate forming wafer 40 is ensured.

Next, in a bonding film forming step, a bonding film 35 is formed on an upper surface of the base substrate forming wafer 40 using a conductive material by patterning (S103). At the same time, in a routing electrode forming step, a plurality of routing electrodes 36, 37 which are electrically connected with the respective pairs of penetration electrodes 32, 33 are formed (S104). In FIG. 17, for facilitating the understanding of the drawing, the bonding film 35 is not shown.

The second wafer preparation step is finished at this point of time.

Figure 12:
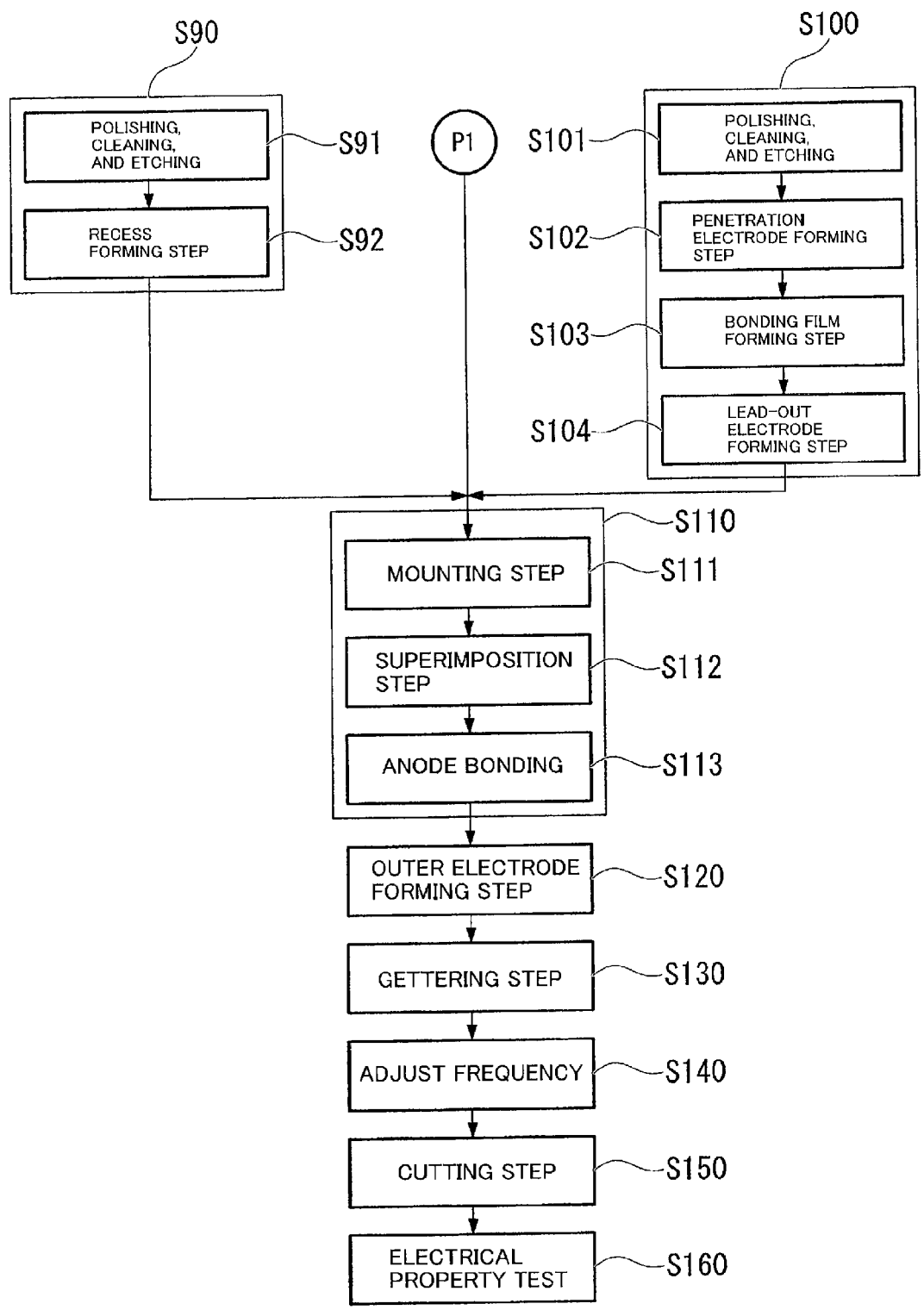
FIG. 12 is a flowchart which follows the flowchart shown in FIG. 11.

In FIG. 12, the bonding film forming step (S103) and the routing electrode forming step (S104) are performed in this order. However, the order of steps is not limited to such order of steps, and may be suitably changed or some or all of these steps may be simultaneously performed.

Next, in a bonding step, the base substrate forming wafer 40 and the lid substrate forming wafer 50 are bonded to each other (S110). To explain this bonding step in detail, firstly, in a mount step, a plurality of prepared piezoelectric vibrating pieces 4 are respectively bonded to an upper surface side of the base substrate forming wafer 40 through the routing electrodes 36, 37 (S111). Here, the bump B made of gold or the like is firstly formed on the pair of routing electrodes 36, 37 respectively. Then, the base portions 12 of the piezoelectric vibrating pieces 4 are mounted on the bumps B and, thereafter, the piezoelectric vibrating pieces 4 are pressed to the bumps B while heating the bumps B at a predetermined temperature. Accordingly, the piezoelectric vibrating pieces 4 are mechanically supported on the bumps B and, at the same time, the mount electrodes 16, 17 and the routing electrodes 36, 37 are electrically connected with each other. Accordingly, at this point of time, the pair of excitation electrodes 15 of the piezoelectric vibrating piece 4 is respectively made conductive with the pair of penetration electrodes 32, 33.

After finishing mounting of the piezoelectric vibrating piece 4, in an overlapping step, the lid substrate forming wafer 50 is overlapped to the base substrate forming wafer 40 (S112). To be more specific, using a reference mark not shown in the drawing or the like as an index, both wafers 40, 50 are aligned to an accurate position. Accordingly, the piezoelectric vibrating piece 4 and the routing electrodes 36, 37 are brought into a state where the piezoelectric vibrating piece 4 and the routing electrodes 36, 37 are housed in the cavity C surrounded by the recessed portion 3a formed in the base forming wafer 40 and both wafers 40, 50.

After the overlapping step, two overlapped wafers 40, 50 are put into an anode bonding device not shown in the drawing, and both wafers 40, 50 are bonded to each other by anode bonding such that a predetermined voltage is applied to the wafers 40, 50 in a predetermined temperature atmosphere (S113). To be more specific, the predetermined voltage is applied between the bonding film 35 and the lid substrate forming wafer 50. An electrochemical reaction is generated on an interface between the bonding film 35 and the lid substrate forming wafer 50 so that the bonding film 35 and the lid substrate forming wafers 50 are strongly adhered to each other by anode bonding. Accordingly, it is possible to obtain a wafer body 60 shown in FIG. 17 where the base substrate forming wafer 40 and the lid substrate forming wafer 50 are bonded to each other.

In FIG. 17, for facilitating the understanding of the drawing, the wafer body 60 is shown in an exploded manner, and a dotted line M indicates a cutting line for cutting in a cutting step performed later.

The bonding step is finished with the above-mentioned processing.

Next, in an outer electrode forming step, a conductive material is patterned on a lower surface of the base substrate forming wafer 40, and a pair of outer electrodes 38, 39 which are respectively electrically connected with the pair of penetration electrodes 32, 33 are formed in plural (S120). Due to this step, the piezoelectric vibrating piece 4 housed in the inside of the cavity C can be operated using the outer electrodes 38, 39.

Next, in a gettering step, a laser beam is radiated to the gettering film 74 of the piezoelectric vibrating piece 4 housed in the inside of each cavity C of the wafer body 60 thus adjusting the degree of vacuum in the cavity C (S130). To be more specific, the wafer body 60 is mounted on a gettering adjustment machine not shown in the drawing, the piezoelectric vibrating piece 4 is vibrated by applying a predetermined voltage to the outer electrodes 38, 39 in the inside of the gettering adjustment machine, and a series vibration resistance value which has the proportional relationship with an equivalent resistance value is measured. Gettering is performed proper times by radiating a laser beam to the gettering film 74 from the base substrate forming wafer 40 side based on the series vibration resistance value, for example, thus activating the gettering film 74. By radiating the laser beam to the gettering film 74, the laser radiation flaw 75 is formed on the gettering film 74.

As a method of determining the proper number of times of gettering, for example, a threshold value of the series vibration resistance value may be preliminarily set for every kind of piezoelectric vibrator 1, and the number of times of gettering may be determined to be proper when the series vibration resistance value becomes lower than the threshold value. Further, the proper number of times of gettering may be determined by performing gettering after storing the series vibration resistance value immediately before gettering, calculating a rate of change of the series vibration resistance value between immediately before gettering and immediately after gettering, and by comparing the rate of change with a preliminarily set value.

Subsequent to the gettering step, in a form of the wafer body 60, in a fine adjustment step, frequency of the individual piezoelectric vibrating piece 4 housed in the inside of the cavity C is finely adjusted such that the frequency falls within a predetermined range (S140). To be more specific, the piezoelectric vibrating piece 4 is vibrated by applying a voltage to the pair of outer electrodes 38, 39 formed on a lower surface of the base substrate forming wafer 40. Then, a laser beam is radiated to the fine adjustment film 21b of the weight metal film 21 from the outside through the base substrate forming wafer 40 while measuring frequency thus vaporizing the fine adjustment film 21b of the weight metal film 21. Due to such processing, a weight of a distal end side of the pair of vibration arm portions 10, 11 is changed so that frequency of the piezoelectric vibrating piece 4 can be finely adjusted such that the frequency of the piezoelectric vibrating piece 4 falls within a predetermined range of nominal frequency.

After the fine adjustment of frequency is finished, in a cutting step, the bonded wafer body 60 is cut into small pieces along cutting lines M shown in FIG. 17 (S150). As a result, it is possible to manufacture a plurality of two-layered-structure surface-mount-device piezoelectric vibrator 1 shown in FIG. 1 each of which houses the piezoelectric vibrating piece 4 in the inside of the package 9 at a time.

It may be possible to change the order of steps such that the fine adjustment step (S140) is performed after cutting the bonded wafer body 60 into individual piezoelectric vibrators 1 by performing the cutting step (S150). However, by performing the fine adjustment step (S140) prior to the cutting step (S150) as described above, it is possible to perform the fine adjustment of frequency in a form of the wafer body 60 and hence, the fine adjustment of frequency can be performed more efficiently with respect to the plurality of piezoelectric vibrators 1. Accordingly, the throughput can be enhanced so that this order of steps is preferable.

Thereafter, electric characteristics of the inside of the piezoelectric vibrating piece 4 are inspected (S160). That is, resonance frequency, a resonance resistance value, drive level characteristics (resonance power dependency of resonance frequency and resonance resistance value) and the like of the piezoelectric vibrating piece 4 are measured and checked. Further, an insulation resistance characteristic and the like of the piezoelectric vibrating piece 4 are also checked. Finally, an appearance inspection of the piezoelectric vibrator 1 is performed so as to make a final check of a size, quality and the like of the piezoelectric vibrating piece 4. The manufacture of the piezoelectric vibrator 1 is finished with the processing.

As has been explained heretofore, according to the piezoelectric vibrator 1 of this embodiment, the metal layer 71 included in the excitation electrode 15, the first weight layer 73a included in the weight metal film 21 and the gettering film 74 are formed using the same material and hence, in the process of manufacturing the piezoelectric vibrator 1, it is possible to form the metal layer 71, the first weight layer 73a and the gettering film 74 simultaneously with the vibration arm portions 10, 11 whereby the piezoelectric vibrator 1 can be manufactured efficiently. Accordingly, the piezoelectric vibrator 1 can be manufactured at a low cost.

Further, the finishing layers 72b of the mount electrodes 16, 17 and the second weight layer 73b of the weight metal film 21 are formed using the same material and hence, in the process of manufacturing the piezoelectric vibrator 1, the finishing layers 72b and the second weight layer 73b can be simultaneously formed thus enabling the more efficient manufacture of the piezoelectric vibrator 1.

Still further, in this embodiment, the finishing layers 72b and the second weight layer 73b are made of gold and hence, it is possible to impart wear resistance to the finishing layers 72b and the second weight layer 73b thus allowing these parts to exhibit stable performances for a long period whereby the piezoelectric vibrator 1 can acquire high quality. Particularly, when the finishing layers 72b and the second weight layer 73b are exposed in the inside of the cavity C as in the case of this embodiment, a high quality acquisition effect obtained by the provision of wear resistance becomes remarkable.

Further, the gettering film 74 is formed over the whole area of the intermediate portions of the vibrating arm portions 10, 11 and hence, the gettering area to which gettering is applicable on the vibration arm portions 10, 11 can be increased.

Further, the metal layer 71, the first weight layer 73a and the gettering film 74 are formed using the same material and hence, even when the gettering film 74 is formed over the whole area of the intermediate portions of the vibration arm portions 10, 11, there is no possibility that the metal layer 71, the first weight layer 73a and the gettering film 74 are dispersed from each other.

Further, the excitation electrode 15 is covered with the insulation film 20 and hence, when a laser beam is radiated to the gettering film 74, even if a portion of the gettering film 74 to which the laser beam is radiated is scattered toward an excitation electrode 15 side, it is possible to make the scattered gettering film 74 adhere to the insulation film 20 so that it is possible to suppress the adhesion of the scattered gettering film 74 to the excitation electrode 15. Accordingly, it is possible to eliminate a possibility that the excitation electrode 15 is short-circuited due to the adhesion of the scattered gettering film 74.

Further, the excitation electrode 15 can be protected by the insulation film 20 thus suppressing direct contact with the excitation electrode 15 from the outside.

Still further, according to this embodiment, the metal layer 71 of the excitation electrode 15 is formed using chromium and hence, the insulation film 20 made of silicon dioxide which exhibits high adhesiveness to chromium is formed on the metal layer 71 made of chromium whereby the excitation electrode 15 and the insulation film 20 are strongly adhered to each other thus suppressing peeling-off of the insulation film 20.

Further, according to the manufacturing method of the piezoelectric vibrator of this embodiment, the gettering film 74 is formed on the intermediate portions of the vibration arm portions 10, 11, and the fine adjustment step is sequentially performed after the gettering step. Accordingly, it is sufficient to change the laser beam radiation position from the intermediate portions of the vibration arm portions 10, 11 to the distal end portions of the vibration arm portions 10, 11 at the time of starting the fine adjustment step. Accordingly, for example, compared to a case where the gettering film 74 is formed on the proximal portion 12, at the time of starting the fine adjustment step, the distance and time necessary for changing the laser beam radiation position can be shortened thus realizing the further efficient manufacture of the piezoelectric vibrator 1.

As a result of extensive studies which an inventor of the present invention have made, it is found that by radiating a laser beam to chromium which exhibits high adhesiveness to a material (crystal, for example) for forming the vibration arm portions 10, 11 and is preferably adopted as a material for forming the first weight layer 73a of the weight metal film 21, a gettering effect which absorbs a surrounding gas (for example, oxygen) is obtained. Further, the inventor of the present invention also found that the gettering effect of chromium is equal or exceeding a gettering effect of aluminum which is conventionally used as a material for forming a gettering film, for example.

Accordingly, as in the case of this embodiment, by forming the metal layer 71, the first weight layer 73a and the gettering film 74 made of chromium on the outer surfaces of the vibration arm portions 10, 11, it is possible to acquire the previously mentioned manner of operation and the advantageous effects in addition to the strong adhesion of the excitation electrode 15, the weight metal film 21 and the gettering film 74 to the vibration arm portions 10, 11 respectively, and the efficient and reliable enhancement of the degree of vacuum in the cavity C due to gettering.

(Oscillator)

Figure 18:
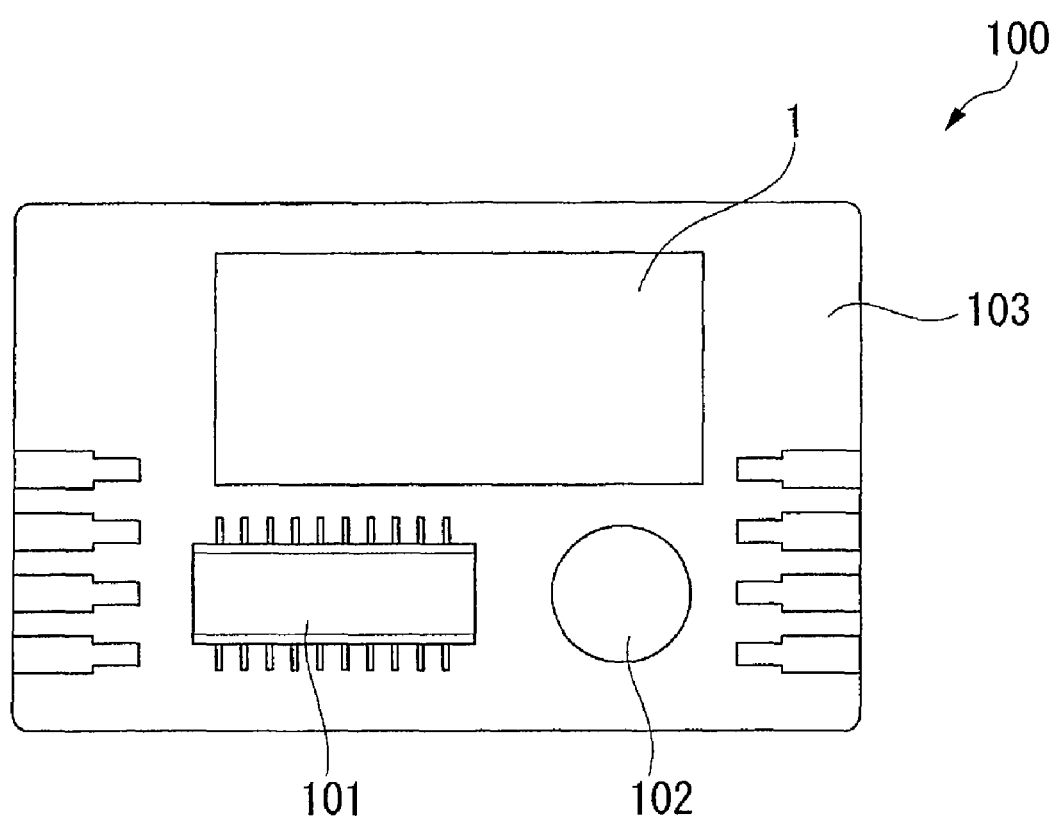
FIG. 18 is a constitutional view showing one embodiment of an oscillator according to the present invention.

Next, one embodiment of the oscillator according to the present invention is explained in conjunction with FIG. 18.

The oscillator 100 of this embodiment is, as shown in FIG. 18, formed of an oscillator in which the piezoelectric vibrator 1 is electrically connected to an integrated circuit 101. The oscillator 100 includes a substrate 103 on which an electronic part 102 such as a capacitor is mounted. The above-mentioned integrated circuit 101 for oscillator is mounted on the substrate 103, and the piezoelectric vibrator 1 is mounted on the substrate 103 in the vicinity of the integrated circuit 101. The electronic part 102, the integrated circuit 101 and the piezoelectric vibrator 1 are electrically connected with each other by a wiring pattern not shown in the drawing. The respective constitutional parts are molded by a resin not shown in the drawing.

In the oscillator 100 having such constitution, when voltage is applied to the piezoelectric vibrator 1, the piezoelectric vibrating piece 4 arranged in the inside of the piezoelectric vibrator 1 vibrates. This vibration is converted into an electric signal due to a piezoelectric characteristic which the piezoelectric vibrating piece 4 possesses, and the electric signal is inputted to the integrated circuit 101. Various processing are applied to the inputted electric signal by the integrated circuit 101, and a frequency signal is outputted from the integrated circuit 101. Accordingly, the piezoelectric vibrator 1 functions as an oscillation element.

Further, by selectively setting the constitution of the integrated circuit 101, for example, an RTC (real time clock) module or the like corresponding to a request, it is possible to impart, besides a function as a timepiece-use single-function oscillator or the like, a function of controlling an operation date and time of the oscillator or an external device or a function of providing time, calendar and the like to the oscillator 100.

According to this embodiment, the oscillator 100 is provided with the piezoelectric vibrator 1 manufactured at a low cost and hence, the oscillator 100 can be manufactured at a low cost.

(Electronic Device)

Figure 19:
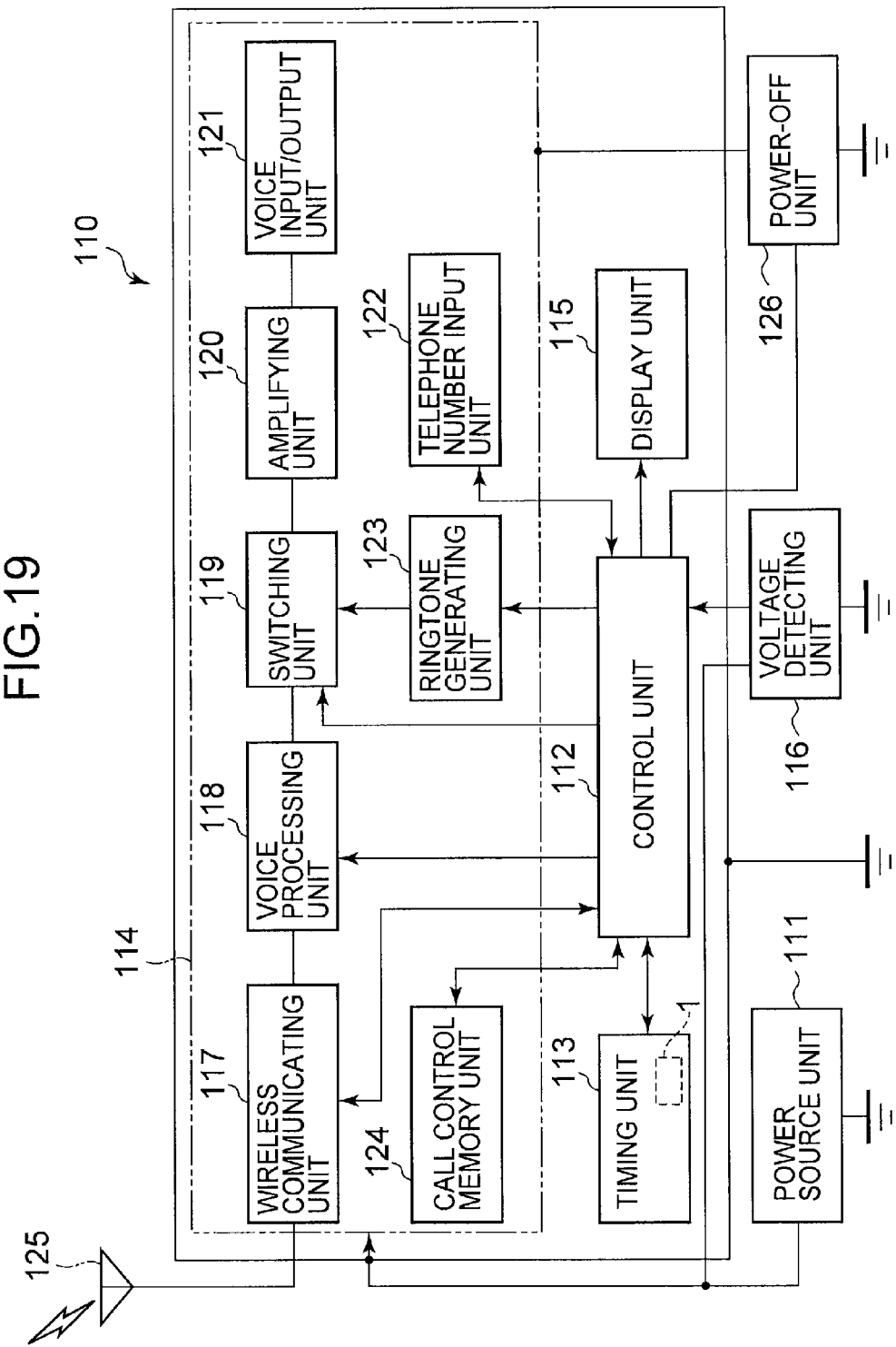
FIG. 19 is a constitutional view showing one embodiment of an electronic device according to the present invention.

Next, one embodiment of the electronic device according to the present invention is explained in conjunction with FIG. 19. The explanation is made with respect to an example where the electronic device is a portable information device 110 which includes the above-mentioned piezoelectric vibrator 1.

Firstly, the portable information device 110 of this embodiment is a device which is represented by a mobile phone and is a developed or improved form of a conventional wrist watch. The portable information device 110 resembles the wrist watch in appearance. A liquid crystal display is arranged on a portion of the portable information device 110 which corresponds to a dial of the wrist watch, and a present time or the like can be displayed on a screen of the liquid crystal display. Further, when the portable information device 110 is used as a communication device, a user removes the portable information device 110 from his wrist, and performs communication in the same manner as a mobile phone of the related art by a speaker and a microphone incorporated into an inner portion of a band. However, the portable information device 110 is remarkably miniaturized and light-weighted compared to the mobile phone of the related art.

Next, the constitution of the portable information device 110 of this embodiment is explained. The portable information device 110 includes, as shown in FIG. 19, a piezoelectric vibrator 1 and a power source part 111 for power supply. The power source part 111 is formed of a lithium secondary battery, for example. To the power source part 111, a control part 112 which performs various controls, a timer part 113 which counts time or the like, a communication part 114 which performs communication with the outside, a display part 115 which displays various information, and a voltage detection part 116 which detects voltages of the respective functional parts are connected to each other in parallel. Electricity is supplied to the respective functional parts from the power source part 111.

The control part 112 performs the transmission and the reception of voice data, the measurement, display and the like of a present time and an operational control of the whole system by controlling the respective functional parts. Further, the control part 112 includes a ROM in which programs are preliminarily written, a CPU which reads and executes the programs written in the ROM, a RAM which is used as a work area of the CPU and the like.

The timer part 113 includes an integrated circuit which incorporates an oscillation circuit, a register circuit, a counter circuit, an interface circuit and the like therein, and the piezoelectric vibrator 1. When a voltage is applied to the piezoelectric vibrator 1, the piezoelectric vibrating piece 4 vibrates, the vibrations are converted into an electric signal due to a piezoelectric characteristic which crystal possesses, and the electric signal is inputted to the oscillation circuit. An output of the oscillation circuit is binalized and the binalized value is counted by the register circuit and the counter circuit. Then, the transmission/reception of signals is performed between the timer part 113 and the control part 112 via the interface circuit, and a present time, a present date, calendar information and the like are displayed on the display part 115.

The communication part 114 has the substantially same functions as a mobile phone of the related art, and includes a wireless part 117, a voice processing part 118, a switching part 119, an amplifying part 120, a voice inputting/outputting part 121, a telephone number inputting part 122, an incoming call sound generation part 123, and a calling-control memory part 124.

The wireless part 117 performs the transmission/reception of various data such as voice data with a base station through an antenna 125. The voice processing part 118 performs coding and decoding of a voice signal inputted from the wireless part 117 or the amplifying part 120. The amplifying part 120 amplifies a signal received from the voice processing part 118 or the voice inputting/outputting part 121 to a predetermined level. The voice inputting/outputting part 121 is formed of a speaker, a microphone or the like, and makes an incoming call sound or a received voice loud or collects voice.

Further, the incoming call sound generation part 123 generates an incoming call sound in response to calling from a base station. The switching part 119 switches the amplifying part 120 connected to the voice processing part 118 to the incoming call sound generation part 123 when a call arrives so that an incoming call sound generated by the incoming call sound generation part 123 is outputted to the voice inputting/outputting part 121 through the amplifying part 120.

Here, the calling control memory part 124 stores a program relating to an incoming/outgoing call control in communication. Further, the telephone number inputting part 122 includes, for example, numeral keys ranging from 0 to 9 and other keys. By pushing these numeral keys or the like, a user can input the telephone number of call destination or the like.

The voltage detection part 116, when a voltage applied to the respective functional parts such as the control part 112 from the power source part 111 becomes lower than a predetermined value, detects such lowering of voltage and notifies the lowering of voltage to the control part 112. The predetermined voltage value at this point of time is a value which is preliminarily set as minimum voltage necessary for stably driving the communication part 114, and is set to approximately 3V, for example. The control part 112 which receives the notification of lowering of voltage from the voltage detection part 116 prohibits operations of the wireless part 117, the voice processing part 118, the switching part 119 and the incoming call sound generation part 123. Particularly, the operation stop of the wireless part 117 which consumes large power is inevitable. Further, a message that a remaining battery quantity is short so that the communication part 114 is inoperable is displayed on the display part 115.

That is, due to the combined operation of the voltage detection part 116 and the control part 112, an operation of the communication part 114 can be prohibited and a message which indicates the prohibition of the operation of the communication part 114 can be displayed on the display part 115. This display may be formed of a character message. However, as a more intuitive display, a x (bad) mark may be attached to a telephone icon displayed on an upper part of a display screen of the display part 115.

The electronic device is provided with a power source breaking part 126 which can selectively break a power source of a portion relating to a function of the communication part 114. In this case, it is possible to stop the function of the communication part 114 more reliably.

Further, in this embodiment, the electronic device includes the piezoelectric vibrator 1 which is manufactured at a low cost and hence, it is possible to reduce a manufacturing cost of the portable information device 110.

(Radio-Controlled Timepiece)

Figure 20:
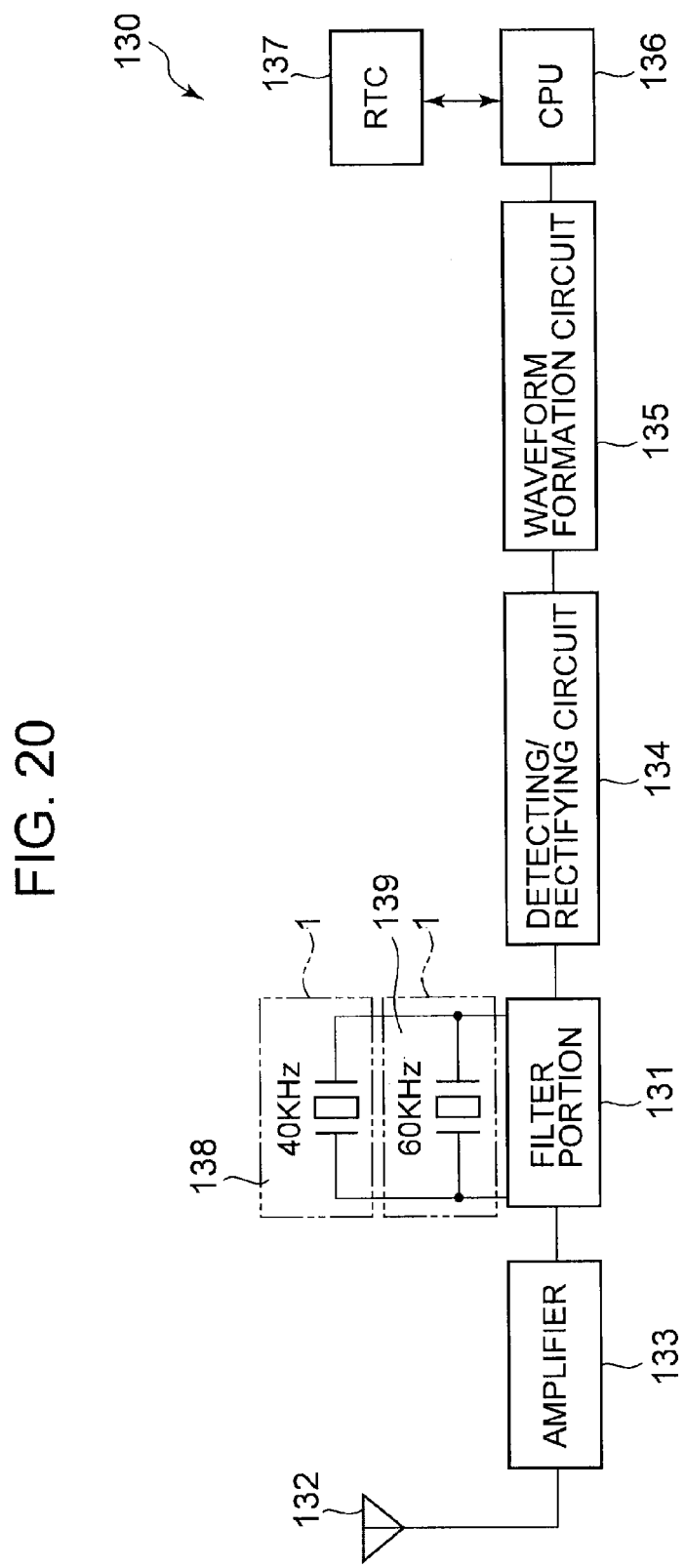
FIG. 20 is a constitutional view of a radio-controlled timepiece according to one embodiment of the present invention.
Figure 21:
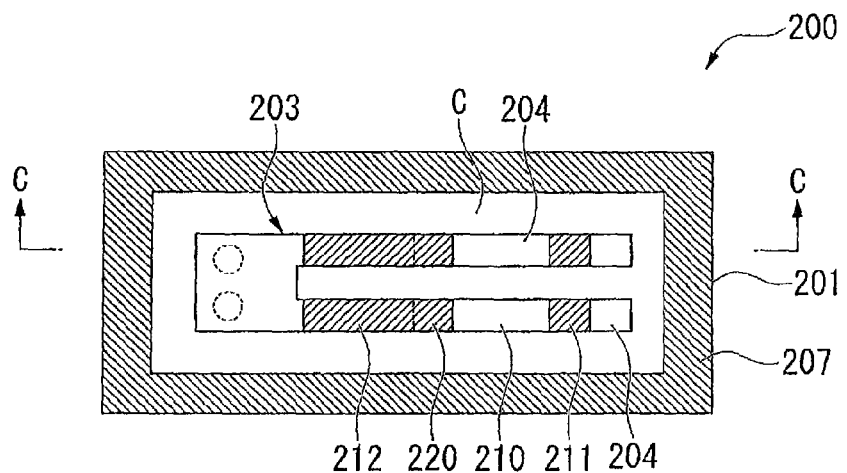
FIG. 21 is a plan view showing a state of a conventional piezoelectric vibrator from which a lid substrate is removed.
Figure 22:
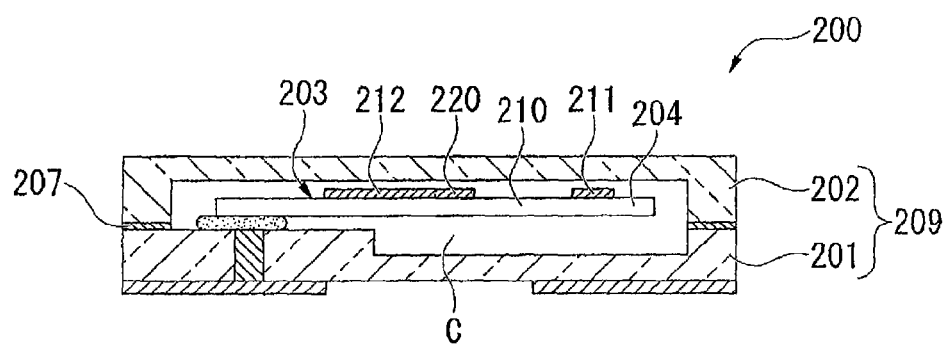
FIG. 22 is a cross-sectional view taken along a line D-D in FIG. 21.

Next, one embodiment of the radio-controlled timepiece according to the present invention is explained in conjunction with FIG. 20.

The radio-controlled timepiece 130 of this embodiment, as shown in FIG. 20, is a timepiece which includes the piezoelectric vibrator 1 which is electrically connected to a filter part 131, and has a function of receiving a standard electric wave containing timepiece information, automatically correcting time to correct time, and displaying the corrected time.

In Japan, transmission installations (transmission stations) which transmit the standard electric wave are located in Fukushima prefecture (40 kHz) and Saga prefecture (60 kHz) and transmit the standard electric waves respectively. A long wave having frequency of 40 kHz or 60 kHz has both of property that the wave propagates on a ground and property that the wave propagates while being reflected between an ionosphere and a ground and hence, the long wave has a wide propagation range whereby the standard electric wave can cover all areas of Japan with the above-mentioned two transmission installations.

The functional constitution of the radio-controlled timepiece 130 is explained in detail hereinafter.

The antenna 132 receives the standard electric wave formed of a long wave having frequency of 40 kHz or 60 kHz. The standard electric wave formed of long wave is an electric wave which is obtained by AM-modulating a carrier wave having frequency of 40 kHz or 60 kHz by time information called as a time code. The received standard electric wave formed of a long wave is amplified by an amplifier 133, and is filtered by a filter part 131 having a plurality of piezoelectric vibrators 1, and is tuned. The piezoelectric vibrators 1 of this embodiment include crystal vibrator parts (piezoelectric vibrating pieces) 138, 139 having resonance frequency of 40 kHz or 60 kHz as same as the above-mentioned frequency of the carrier wave respectively.

Further, a filtered signal of predetermined frequency is detected and demodulated by a detection/rectifying circuit 134. Subsequently, the time code is taken out through a waveform shaping circuit 135, and is counted by a CPU 136. The CPU 136 reads information on present year, cumulative days, day of week, time and the like. The read information is reflected on an RTC 137 so that correct time information is displayed.

The carrier wave has frequency of 40 kHz or 60 kHz and hence, crystal vibrator parts 138, 139 are preferably formed of a vibrator having the above-mentioned tuning-fork structure.

Although the above-mentioned explanation is made with respect to the radio-controlled timepiece used in Japan, the frequencies of standard electric waves of long wave used overseas differ from the standard electric wave used in Japan. For example, the standard electric wave having frequency of 77.5 kHz is used in Germany. Accordingly, in incorporating the radio-controlled timepiece 130 also compatible with the oversea use into a portable device, the piezoelectric vibrator 1 having frequency different from the frequency used in Japan becomes necessary.

Further, in this embodiment, the radio-controlled timepiece includes the piezoelectric vibrator 1 which is manufactured at a low cost and hence, it is possible to reduce a manufacturing cost of the radio-controlled timepiece 130.

The technical scope of the present invention is not limited to the above-mentioned embodiments, and various modifications can be added without departing from the gist of the present invention.

For example, in the above-mentioned embodiment, the explanation has been made with respect the case where the grooved piezoelectric vibrating piece 4 which form the groove portions 18 on both surfaces of the vibration arm portions 10, 11 is taken as an example of the piezoelectric vibrating piece 4. However, the piezoelectric vibrating piece 4 may be a piezoelectric vibrating piece which has no groove portions. However, by forming the groove portions 18 in the piezoelectric vibrating piece, when a predetermined voltage is applied to the pair of excitation electrodes 15, electric field efficiency between the pair of excitation electrodes 15 can be enhanced and hence, the vibration characteristics can be further enhanced by further suppressing a vibration loss. That is, a CI value (Crystal Impedance) can be further reduced so that the performances of the piezoelectric vibrating piece 4 can be further enhanced. From this point of view, it is preferable to form the groove portions 18 in the piezoelectric vibrating piece 4.

Further, in this embodiment, the base substrate 2 and the lid substrate 3 are bonded to each other by way of the bonding film 35 by anode-bonding. However, the bonding method is not limited to anode-bonding. However, anode-bonding can strongly bond both substrates 2, 3 to each other and hence, anode-bonding is preferable.

Further, in the above-mentioned embodiment, bonding of the piezoelectric vibrating piece 4 is performed by bump-bonding. However, bonding of the piezoelectric vibrating piece 4 is not limited to bump bonding. For example, bonding of the piezoelectric vibrating piece 4 may be performed using a conductive adhesive agent. However, bump bonding allows the piezoelectric vibrating piece 4 to float from an upper surface of the base substrate 2 thus naturally ensuring a minimum vibration gap necessary for vibrations. Accordingly, bump bonding is desirable.

Further, the piezoelectric vibrating piece 4 may not include the insulation film 20.

In the above-mentioned embodiment, the gettering film 74 is formed on the whole area of the intermediate portions of the vibration arm portions 10, 11. In place of forming the gettering film 74 in this manner, the gettering film 74 may be partially formed on the intermediate portions of the vibration arm portions 10, 11. In the gettering step, when a laser beam is radiated to the gettering film 74 from a base substrate forming wafer 40 side or a lid substrate forming wafer 50 side, it is preferable to form the gettering film 74 on both main surfaces of the intermediate portions of the vibration arm portions 10, 11. It is more preferable to form the gettering film 74 over the whole area of both main surfaces of the intermediate portions of the vibration arm portions 10, 11.

In the above-mentioned embodiment, the finishing layers 72b of the weight metal layer 21 of the mount electrodes 16, 17 and the second weight layer 73b are formed using the same material, for example, gold. However, these layers may be made of different materials or may be made of a material different from gold.

A material for forming the metal layer 71 of the excitation electrode 15, the first weight layer 73a of the weight metal film 21 and the gettering layer 74 is not limited to the above-mentioned material provided that the same material is used.

The excitation electrode 15, the mount electrodes 16, 17 and the weight metal film 21 are not limited to the above-mentioned embodiment. For example, the excitation electrode 15 may not be always necessary to be formed of only the metal layer 71, and may be formed by stacking a plurality of metal films. The mount electrodes 16, 17 may be formed of a single layer or may be formed by stacking three or more layers. The weight metal film 21 may be formed of two or less layers or may be formed by stacking four or more layers.

Further, for example, the mount electrodes 16, 17 may not include the finishing layer 72b, and the weight metal film 21 may be formed by locally forming the second weight layer 73b and the third weight layer 73c. In this case or the like, in the manufacturing method of the piezoelectric vibrator according to this embodiment, the second film forming step and the second removal step may not be performed. In this case, by performing the first film forming step and the first removal step, the metal layer 71, the first weight layer 73a and the gettering film 74 can be simultaneously formed on the vibration arm portions 10, 11.

Further, in this embodiment, the metal layer 71 of the excitation electrode 15 and the first weight layer 73a of the weight metal film 21 are formed using the same material as the gettering film 74. However, provided that the excitation electrode 15 and the weight metal film 21 respectively contain the metal films (first metal film and the second metal film) formed using the same material as the gettering film 74, the metal layer 71 of the excitation electrode 15 and the first weight layer 73a of the weight metal film 21 are not limited to the above-mentioned material. For example, the metal layer 71 of the excitation electrode 15 and the second weight layer 73b of the weight metal film 21 may be formed using the same material as the gettering film 74.

Besides the above-mentioned modifications, the constitutional elements of the above-mentioned embodiments can be suitably replaced with well-known constitutional elements without departing from the gist of the present invention, and the above-mentioned modifications may be suitably combined with each other.

What is claimed is:

1. A piezoelectric vibrator comprising:
a hermetically closed casing comprising first and second substrates with a cavity therebetween, which are anodically bonded together;
a piezoelectric vibrating strip having a proximal end and distal end and secured inside the cavity;
a first layer applied at a substantially uniform thickness to cover the piezoelectric vibrating strip, the first layer being made of a material having a gettering characteristic, wherein the first layer constitutes an adjustable weight in a first section of the piezoelectric vibrating strip located close to the distal end, driving electrodes in a second section thereof located between the first section and the proximal end and mount electrodes in a third section thereof located close to the proximal end between the second section and the proximal end;
a second layer applied on the first layer at a substantially uniform thickness in the first and third sections so as to expose the first layer in part in the first section and at least in part in the second section, wherein the second layer constitutes an adjustable weight in the first section and mount electrodes in the third section; and
an insulation layer applied to at least partially cover the second section so as to expose the second layer at least in part in the third section and expose both the first and second layers at least in part in the first section such that the first layer is directly irradiatable in the first section with a laser from the outside of the casing.

2. The piezoelectric vibrator according to claim 1, wherein the piezoelectric vibrating strip comprises a pair of vibrating arms.

3. The piezoelectric vibrator according to claim 1, wherein the first layer is made of a material selected from the group consisting of chromium, titanium, vanadium and zirconium.

4. An oscillator comprising the piezoelectric vibrator according to claim 1, which is connected to an integrated circuit of the oscillator.

5. An electronic device comprising:
a clock; and
the piezoelectric vibrator according to claim 1 electrically connected to the clock.

6. A radio-controlled clock comprising:
a filter; and
the piezoelectric vibrator according to claim 1 electrically connected to the filter.

7. The piezoelectric vibrator according to claim 1, further comprising a third layer applied in the first section to cover at least part of the second layer, wherein the third layer constitutes an adjustable weight in the first section.

* * * * *